(12) United States Patent
Omori et al.

(10) Patent No.: US 10,773,887 B2
(45) Date of Patent: Sep. 15, 2020

(54) ARTICLE TRANSPORT FACILITY

(71) Applicant: Daifuku Co., Ltd., Osaka-shi (JP)

(72) Inventors: Kazuya Omori, Hinocho (JP); Takeshi Abe, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 980 days.

(21) Appl. No.: 15/348,344

(22) Filed: Nov. 10, 2016

(65) Prior Publication Data
US 2017/0138069 A1    May 18, 2017

(30) Foreign Application Priority Data

Nov. 13, 2015    (JP) .................................. 2015-223014

(51) Int. Cl.
  *B65G 1/04*    (2006.01)
  *H01L 21/677*    (2006.01)

(52) U.S. Cl.
  CPC ...... *B65G 1/0407* (2013.01); *H01L 21/67769* (2013.01)

(58) Field of Classification Search
  CPC ........ E04G 3/20; B65G 1/0407; B65G 1/065; B65G 1/026; H01L 21/67769
  USPC ........................................... 414/281, 331.03
  See application file for complete search history.

(56) References Cited

U.S. PATENT DOCUMENTS

| | | | | |
|---|---|---|---|---|
| 4,787,804 A * | 11/1988 | Edenas | ................ | B65G 1/0407 414/254 |
| 4,936,414 A * | 6/1990 | Rybka | ..................... | B66F 11/04 182/2.11 |
| 5,141,380 A * | 8/1992 | Kato | .................... | B65G 1/0421 414/273 |
| 5,586,616 A * | 12/1996 | Ksenych | ................ | B66F 11/04 182/148 |
| 2006/0285948 A1* | 12/2006 | Tsujimoto | ............ | B65G 1/0407 414/279 |

FOREIGN PATENT DOCUMENTS

JP    2007246231 A    9/2007

* cited by examiner

*Primary Examiner* — Glenn F Myers
(74) *Attorney, Agent, or Firm* — The Webb Law Firm

(57) ABSTRACT

An article transport facility includes an article transport device capable of moving along a moving direction in movement sections. The movement sections include a transporting movement section and an out-of-the-way movement section. A work platform includes one or more out-of-trajectory portions located to at least one side along a lateral direction with respect to a mast trajectory, and one or more in-trajectory portions which are located in an area of the mast trajectory that excludes an area in which the mast is located when the article transport device is in the out-of-the-way stop position. Each of the one or more in-trajectory portions is configured to be capable of being moved to a support position located in the mast trajectory, and to an out-of-the-way position in which the in-trajectory portion is out of the mast trajectory along the lateral direction.

6 Claims, 10 Drawing Sheets

ARTICLE TRANSPORT FACILITY

CROSS-REFERENCE TO RELATED APPLICATION

This application claims priority to Japanese Patent Application No. 2015-223014 filed Nov. 13, 2015, the disclosure of which is hereby incorporated in its entirety by reference.

FIELD OF THE INVENTION

The present invention relates to an article transport facility comprising an article transport device capable of moving along a moving direction in movement sections to transport an article, wherein the movement sections include a transporting movement section in which the article transport device moves when transporting an article, and an out-of-the-way movement section which is continuous with the transporting movement section and in which the article transport device moves when moving out of the transporting movement section to an out-of-the-way stop position located outside the transporting movement section, wherein the article transport device includes a travel carriage capable of traveling along the moving direction, a mast arranged vertically on the travel carriage, a vertically movable member capable of being moved vertically and of supporting the article that is being transported.

BACKGROUND

An example of conventional article transport facilities is described in JP Publication of Application No. 2007-246231 (Patent Document 1). In the article transport facility of Patent Document 1, a section through which an article transport device moves includes a transporting movement section and an out-of-the way movement section. When transporting an article with the article transport device, the article transport device moves in the transporting movement section whereas, when moving the article transport device out of the transporting movement section, for example, to perform a maintenance work on an article transport device, the article transport device is caused to move from the transporting movement section to an out-of-the-way stop position in the out-of-the-way movement section.

When performing a maintenance work on an upper part of the article transport device which has been moved to the out-of-the-way movement section, a worker would place a stepladder near the article transport device, and get onto the stepladder to perform the maintenance work on the article transport device. Thus, when performing a maintenance work, it is necessary to move the stepladder to near the article transport device; thus, it has been burdensome to move the stepladder when performing a maintenance work. In addition, as the height of the article transport device increases, it is necessary to use a larger-sized stepladder; and, a larger-sized stepladder requires a larger setting surface, which may lead to a problem that the stepladder cannot be appropriately placed.

Thus, it is conceivable to make it unnecessary to move and place a stepladder when performing a maintenance work on an upper part of an article transport device, by installing a work platform located to one lateral side of the article transport device which has been moved to the out-of-the-way movement section. However, when it is impossible to secure a large space that is located to one lateral side of the article transport device which has been moved to the out-of-the-way movement section because there is only a limited floor space that can be used to install the article transport facility, or because there are other structures in the surrounding area of the article transport facility, it is difficult to install a large work platform there.

SUMMARY OF THE INVENTION

An article transport facility is desired in which it is easy to have a work platform which has a relatively large portion which a worker can get onto while reducing the amount of any increase in the floor space which the facility occupies.

The arrangement of an article transport facility in accordance with the present invention is that the article transport facility comprises an article transport device capable of moving along a moving direction in movement sections to transport an article, wherein the movement sections include a transporting movement section in which the article transport device moves when transporting an article, and an out-of-the-way movement section which is continuous with the transporting movement section and in which the article transport device moves when moving out of the transporting movement section to an out-of-the-way stop position located outside the transporting movement section, wherein the article transport device includes a travel carriage capable of traveling along the moving direction, a mast arranged vertically on the travel carriage, a vertically movable member capable of being moved vertically and of supporting the article that is being transported.

A work platform which a worker can get onto is provided at a position that is higher than the travel carriage of the article transport device which has been moved to the out-of-the-way stop position, and that is lower than an upper end of the mast, wherein, with a lateral direction being defined to be a direction that intersects the moving direction in plan view, the work platform includes one or more out-of-trajectory portions which are located outside a mast trajectory which is a trajectory of the mast in the out-of-the-way movement section when the article transport device moves from the transporting movement section to the out-of-the-way stop position and which are located to at least one side, along the lateral direction, with respect to the mast trajectory, and one or more in-trajectory portions located in an area of the mast trajectory that excludes an area in which the mast is located when the article transport device is in the out-of-the-way stop position, and wherein each of the one or more in-trajectory portions is configured to be capable of being moved to a support position in which a corresponding one of the one or more in-trajectory portions is located in the mast trajectory, and to an out-of-the-way position in which the corresponding one of the one or more in-trajectory portions is out of the mast trajectory along the lateral direction.

With the arrangement described above, by moving each of the one or more in-trajectory portions of the work platform to its out-of-the-way position, the article transport device is allowed to move from the transporting movement section to the out-of-the-way stop position in the out-of-the-way movement section, and from the out-of-the-way stop position in the out-of-the-way movement section to the transporting movement section.

In addition, when each of the one or more in-trajectory portions of the work platform is in its support position, the one or more in-trajectory portions are not located in the area in which the mast, of the article transport device at rest in the out-of-the-way stop position, is located. Thus, with the article transport device at rest in the out-of-the-way stop position, each of the one or more in-trajectory portions of the work platform can be moved to its support position from its out-of-the-way position.

And by moving each of the one or more of the in-trajectory portions of the work platform to its support position with the article transport device at rest in the out-of-the-way stop position, a worker can get onto the work platform having both the one or more out-of-trajectory portions and the one or more in-trajectory portions, to perform a maintenance work on an upper portion of the article transport device with improved efficiency and ease. In addition, since the one or more of in-trajectory portions are located in the mast trajectory when in the support positions, the amount of any increase in the floor space, which the facility occupies when performing a maintenance work, can be reduced.

Thus, by so arranging that a part of the work platform can be placed in the mast trajectory by moving the position or positions of the one or more of the in-trajectory portions, movement of the article transport device in the out-of-the-way movement section is unhindered, and in addition, when performing a maintenance work, a worker can use the one or more in-trajectory portions in addition to the one or more out-of-trajectory portions to perform the work with improved efficiency and ease. In addition, the amount of any increase in the floor space, which the facility occupies when performing a maintenance work, can be reduced compared with a case in which the work platform of the same width consists only of out-of-trajectory portions.

Thus, this arrangement makes it easy to install a work platform which has a relatively large portion which a worker can get onto while reducing the amount of any increase in the floor space which the facility occupies.

Additional features and advantages of the present invention will be further clarified by the following description of exemplary and non-limiting embodiments described with reference to the attached drawings.

DETAILED DESCRIPTION

Embodiments of an article transport facility are described next with reference to the drawings.

Figure 1:
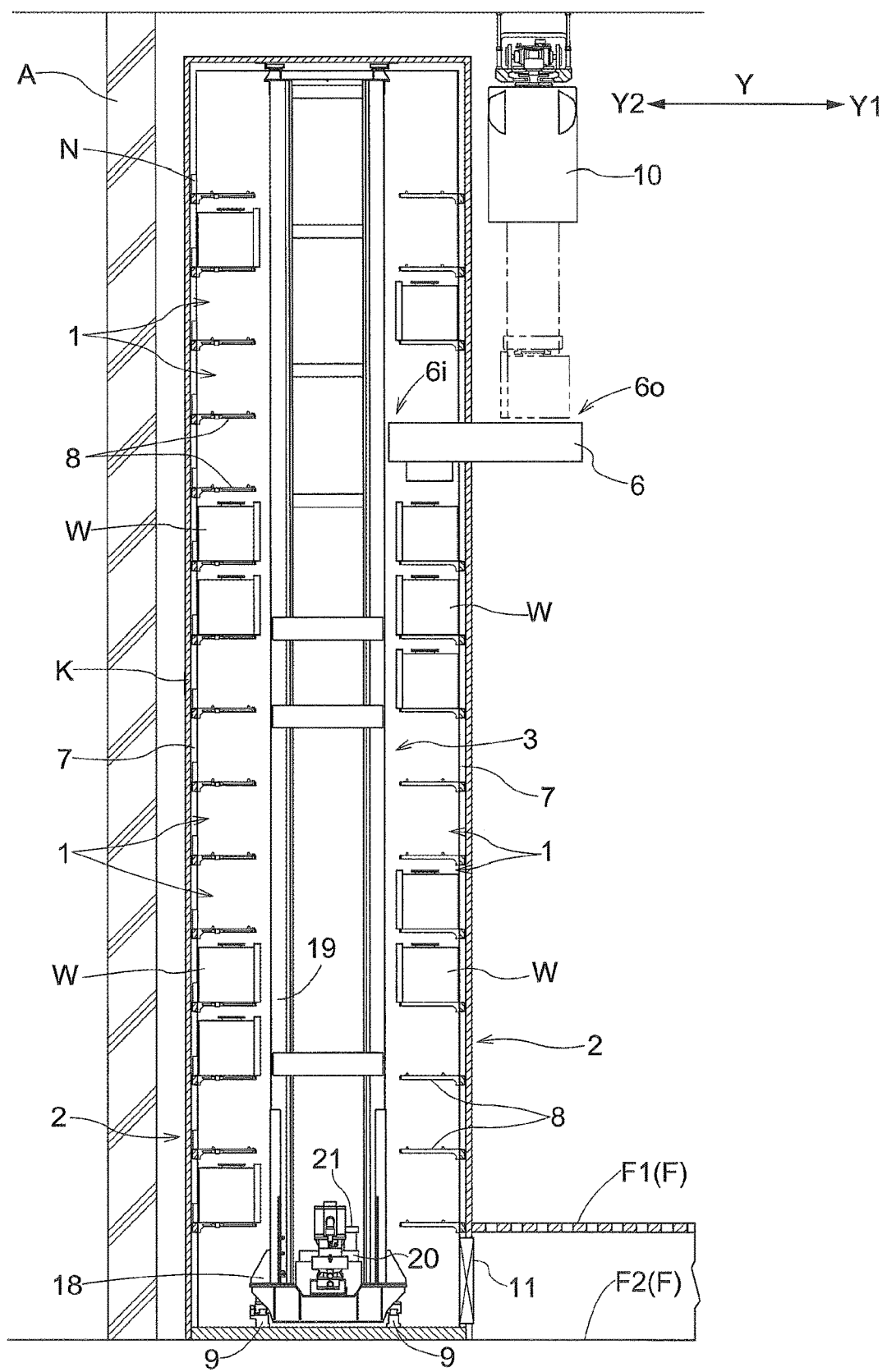
FIG. 1 is a front view of a transport area of an article transport facility.
Figure 2:
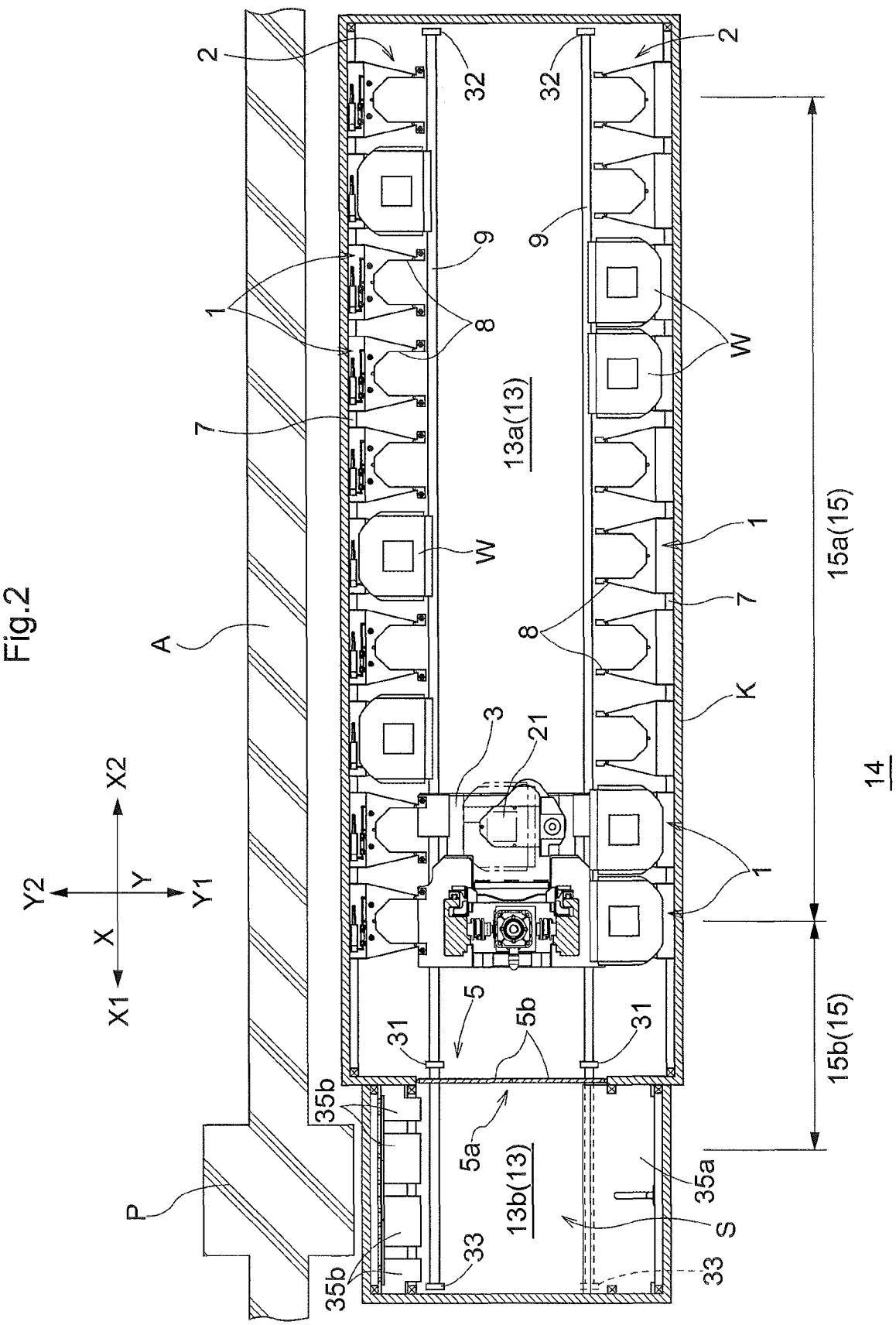
FIG. 2 is a plan view of the article transport facility.

As shown in FIGS. 1 and 2, an article transport facility includes article storage racks 2 having storage sections 1 each of which is for storing a container W as an article, and a stacker crane 3 which is an article transport device which is capable of moving along a moving direction X to transport containers W, one container at a time.

In addition, the article transport facility has walls K that surround the sides of an interior area 13 in which the article storage racks 2 and the stacker crane 3, among other things, are installed, a partition wall 5 which divides the interior area 13 into two areas along the moving direction X of the stacker crane 3, and carry-in-and-out conveyors 6 each of which extends through a wall K to support and transport containers W.

In addition, in the present embodiment, a FOUP (Front Opening Unified Pod) for holding one or more semiconductor substrates is used as a container W (with an article being the container).

As shown in FIG. 2, one direction along the moving direction X (direction in which an out-of-the-way area 13b is located with respect to a transport area 13a) is referred to as the first moving direction X1 whereas the other and opposite direction along the moving direction X (direction in which the transport area 13a is located with respect to the out-of-the-way area 13b) is referred to as the second moving direction X2. The first moving direction X1 is, or corresponds to, the first direction, whereas the second moving direction X2, is, or corresponds to, the second direction.

In addition, as shown in FIGS. 1 and 2, the direction which is perpendicular in plan view to the moving direction X (which is an example of directions that intersect the moving direction X in plan view) is referred to as the lateral direction Y. And one direction along the lateral direction Y (direction in which the article storage rack 2 and the stacker crane 3 are located with respect to a wall A) is referred to as the first lateral direction Y1 whereas the other and opposite direction along the lateral direction Y (direction in which the wall A is located with respect to the article storage rack 2 and the stacker crane 3) is referred to as the second lateral direction Y2.

The article transport facility is installed in a clean room of a down-flow type in which clean air flows downward toward the floor from the ceiling side. As shown in FIG. 1, the floor F of the clean room is formed by a lower floor F2, and an upper floor F1 installed above the lower floor F2.

The lower floor F2 is a floor which does not have through holes for air/gas passage and is made of concrete without through holes in the present embodiment, and on top of which the stacker crane 3 moves.

The upper floor F1 is a grating floor in which a number of through holes that extend vertically through the upper floor F1 are formed, and on top of which a worker walks. In addition, the upper floor F1 is installed at a higher position than a travel carriage 18 of the stacker crane 3 which travels on the lower floor F2. Note that the upper floor F1 is, or corresponds to, a "walking floor" on which a worker can walk.

As shown in FIG. 2, the interior area 13 is divided by the partition wall 5 into the transport area 13a and the out-of-the-way area 13b which are next to each other along the moving direction X. The out-of-the-way area 13b is formed to be located to the first moving direction X1 side with respect to the transport area 13a.

As shown in FIGS. 1 and 2, frameworks 7, each of which is formed by combining frame members vertically and horizontally, are provided in the interior area 13. In the transport area 13a, the article storage racks 2 are formed by attaching support plates 8 to the frameworks 7 whereas, in the out-of-the-way area 13b, an upper work platform 24, a lower work platform 25, and a ladder 26 are supported by the frameworks 7.

As shown in FIGS. 1 and 2, the stacker crane 3 has a travel carriage 18 which travels on travel rails 9 along the moving direction X, a mast 19 arranged vertically on the travel carriage 18, a vertically movable member 20 which can be moved vertically along the mast 19, and a transfer device 21 supported by the vertically movable member 20. The transfer device 21 is configured to transfer a container W from itself to a transfer target location (any of the storage sections 1 or an internal transfer location 6i of the carry-in-and-out conveyors 6) and vice versa.

Although detailed description is omitted, the transfer device 21 has a support portion 21a for supporting a container W, and a projecting and retracting device (not shown) for projecting and retracting the support portion 21a to a projected position (not shown) at which the support portion 21a is projected along the lateral direction Y with respect to the vertically movable member 20 and to a retracted position (position shown in FIG. 1 and FIG. 2) at which the support portion 21a is retracted to the vertically movable member 20 side.

And the transfer device 21 is configured to be able to select either the first lateral direction Y1 or the second lateral direction Y2 as the direction in which the support portion 21a is projected from its retracted position, by rotating the projecting and retracting device about a vertical axis. Thus, the transfer device 21 is configured to be able to transfer the container W to and from any one of the storage sections 1 of either of the pair of the article storage racks 2.

As shown in FIGS. 1 and 2, the article transfer device 21, with the support portion 21a retracted to the retracted position, is formed to be narrower than the mast 19 along the lateral direction Y, and is within in the lateral width of the mast 19 as seen along the moving direction X. Note that, in the present embodiment, the mast 19 is formed by two vertical members that are connected to each other by a number of horizontal members.

The travel carriage 18 is formed to be wider than the mast 19 along the lateral direction Y, and projects to both sides with respect to, and beyond, the mast 19 along the lateral direction Y.

The mast 19 is arranged to stand vertically at a location that is offset in the first moving direction X1 from the center of the travel carriage 18 along the moving direction X. The vertically movable member 20 is located on the second moving direction X2 side of the mast 19, and is supported by the mast 19 in a cantilever fashion (i.e., only by one side of the vertically movable member 20).

As shown in FIGS. 1 and 2, a pair of article storage racks 2 are provided such that the travel path along which the stacker crane 3 moves is located between the pair of article storage racks 2 along the lateral direction Y.

Each of the pair of article storage racks 2 includes a plurality of storage sections 1 arranged along the vertical direction and the moving direction X. And each of the plurality of storage sections 1 has a support plate 8 for supporting a container W stored therein. Nitrogen gas supplying devices N for supplying nitrogen gas to the containers W stored in the storage sections 1 are provided in the article storage rack 2 (of the pair of article storage racks 2) that is located on the second lateral direction Y2 side.

As shown in FIG. 1, each carry-in-and-out conveyor 6 is configured to support and transport a container W between an external transfer location 6o located outside a wall K and the internal transfer location 6i located inside the wall K. A ceiling or overhead transport vehicle 10 picks up and unloads a container W to and from the external transfer location 6o of the carry-in-and-out conveyor 6 installed at a high position. And a worker picks up and unloads a container W to and from the external transfer location 6o of a carry-in-and-out conveyor 6 installed at a low position (not shown).

In the article transport facility, when a container W is placed at the external transfer location 6o of a carry-in-and-out conveyor 6 by the ceiling transport vehicle 10 or a worker, the container W is supported and transported from the external transfer location 6o to the internal transfer location 6i by the carry-in-and-out conveyor 6, and is transported from the internal transfer location 6i to a storage section 1 by the stacker crane 3.

In addition, a container W can be transported from a storage section 1 to the internal transfer location 6i of a carry-in-and-out conveyor 6 by the stacker crane 3. And after the container W is supported and transported from the internal transfer location 6i to the external transfer location 6o by the carry-in-and-out conveyor 6, the container W can be picked up at the external transfer location 6o by the ceiling transport vehicle 10 or a worker.

Movement sections 15 in which the stacker crane 3 moves include a transporting movement section 15a and a out-of-the-way movement section 15b. The transporting movement section 15a is set up as a section in which the stacker crane 3 moves when transporting a container W. The out-of-the-way movement section 15b is set up as a section which is continuous with the transporting movement section 15a and in which the stacker crane 3 moves when moving along the moving direction X from the transporting movement section 15a to an out-of-the-way stop position S located outside the transporting movement section 15a. The out-of-the-way movement section 15b is set up on the first moving direction X1 side with respect to the transporting movement section 15a.

To describe this in more detail, as shown in FIG. 2, first wheel stoppers 31 and second wheel stoppers 32 are installed in the transport area 13a whereas third wheel stoppers 33 are installed in the out-of-the-way area 13b. And the range in which the stacker crane 3 moves when transporting an article between the first wheel stoppers 31 and the second wheel stoppers 32 is set up as the transporting movement section 15a.

Figure 3:
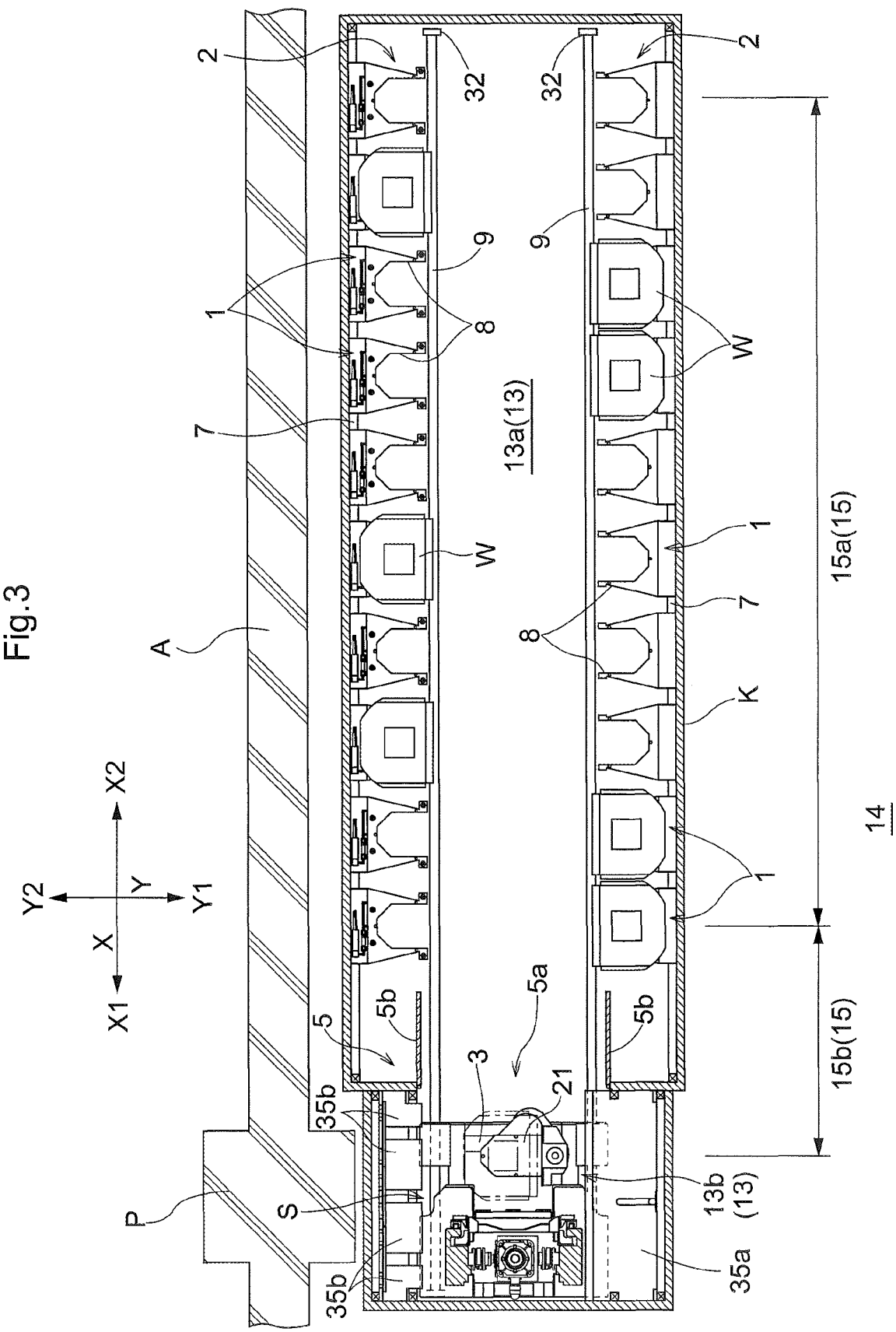
FIG. 3 is a plan view of the article transport facility.

In addition, the out-of-the-way stop position S is set up between the second wheel stoppers 32 and the third wheel stoppers 33. And when the stacker crane 3 is caused to move from the transporting movement section 15a to the out-of-the-way stop position S, the second wheel stoppers 32 are removed as shown in FIG. 3, and then the stacker crane 3 is allowed to move to the out-of-the-way stop position S. And the range in which the stacker crane 3 moves from an end portion, on the first moving direction X1 side, of the transporting movement section 15a to the out-of-the-way stop position S is set up as the out-of-the-way movement section 15b.

And the section which is the sum total of the out-of-the-way movement section 15b and the transporting movement section 15a are the movement sections 15. FIGS. 2 and 3 show the extent of the transporting movement section 15a and the extent of the out-of-the-way movement section 15b in terms of the position of the center, along the moving direction X, of the transfer device 21. In addition, FIG. 3 shows the stacker crane 3 at rest in the out-of-the-way stop position S.

As shown in FIGS. 2 and 3, an opening or space 5a through which the stacker crane 3 can travel is formed in the partition wall 5. And doors 5b which can open and close the opening 5a are provided.

As shown in FIG. 2, the interior area 13 can be divided and separated into the transport area 13a and the out-of-the-way area 13b by switching or moving the doors 5b to a closed state (i.e., by closing the doors 5b) so that inflow of air from the transport area 13a to the out-of-the-way area 13b can be reduced.

In addition, as shown in FIG. 3, the stacker crane 3 is allowed to move between the transporting movement section 15a and the out-of-the-way movement section 15b by switching or moving the doors 5b to an open state (i.e., by opening the doors 5b).

As shown in FIGS. 1 and 2, side wall portions of the walls K (which has no holes except at the location of the carry-in-and-out conveyors 6) surround the sides of the interior area 13. A ceiling wall portion of the walls K is formed with many through holes (i.e., perforated) so that it is configured to allow clean air to flow from the ceiling side of the building into the interior area 13.

In addition, a gas discharge portion 11 for allowing gas within the wall K to move out of the wall K is provided in a portion of a wall K that is located below the upper floor F1 and that covers the first lateral direction Y1 side of the transport area 13a. Thus, clean air flows from the ceiling wall portion of the wall K to within the wall K. And the clean air which has flown inside continues to flow downward toward the floor and is moved out of the wall K through the gas discharge portion 11 together with the nitrogen gas discharged from the containers W stored in the storage sections 1.

In addition, the walls K are, or correspond to, the partitions which partition or block the interior area 13 in which the stacker crane 3, the upper work platform 24, and the ladder 26 are installed, from the external area 14 outside the interior area 13.

Figure 4:
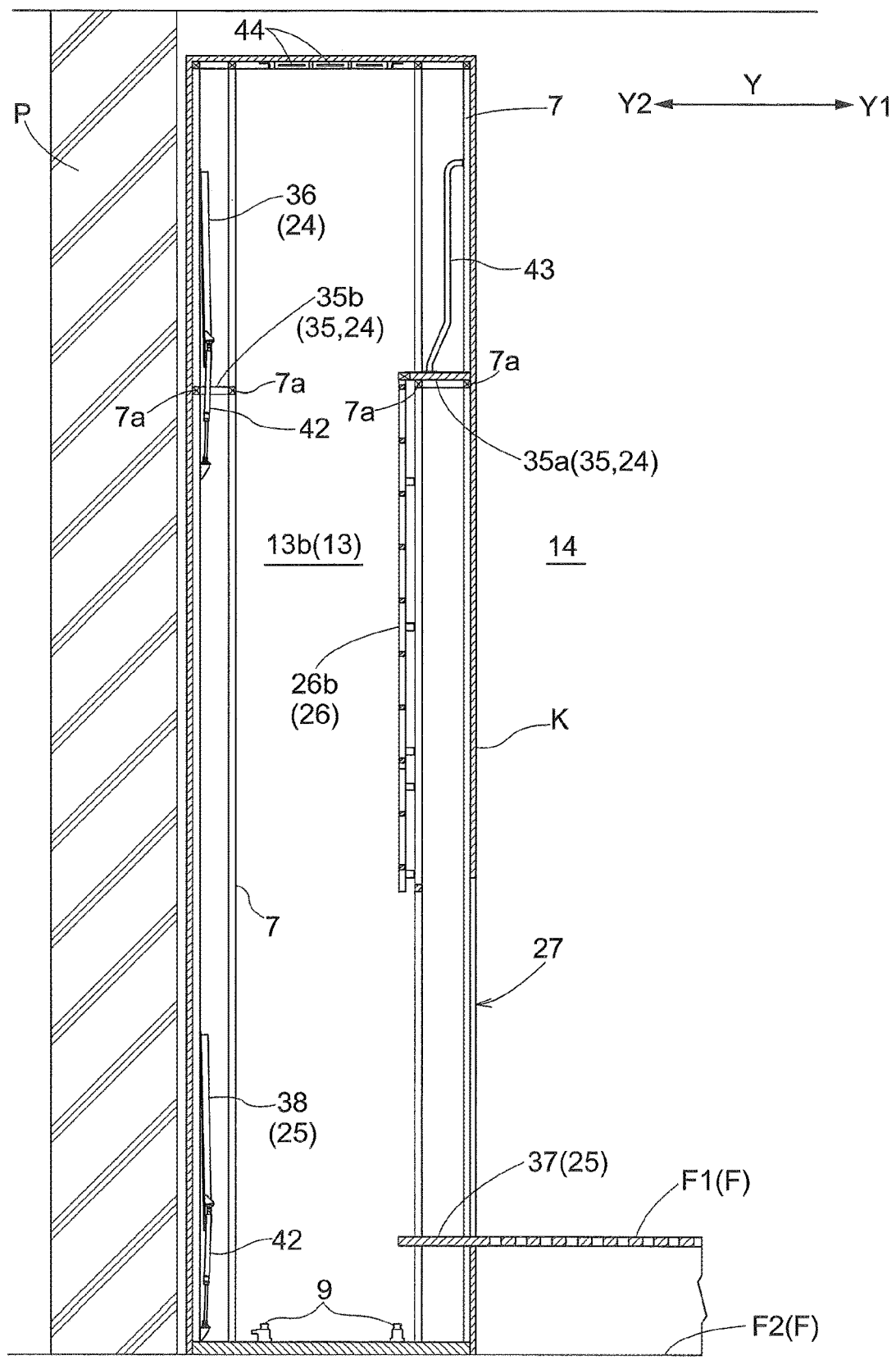
FIG. 4 is a front view of an out-of-the-way area of the article transport facility.
Figure 5:
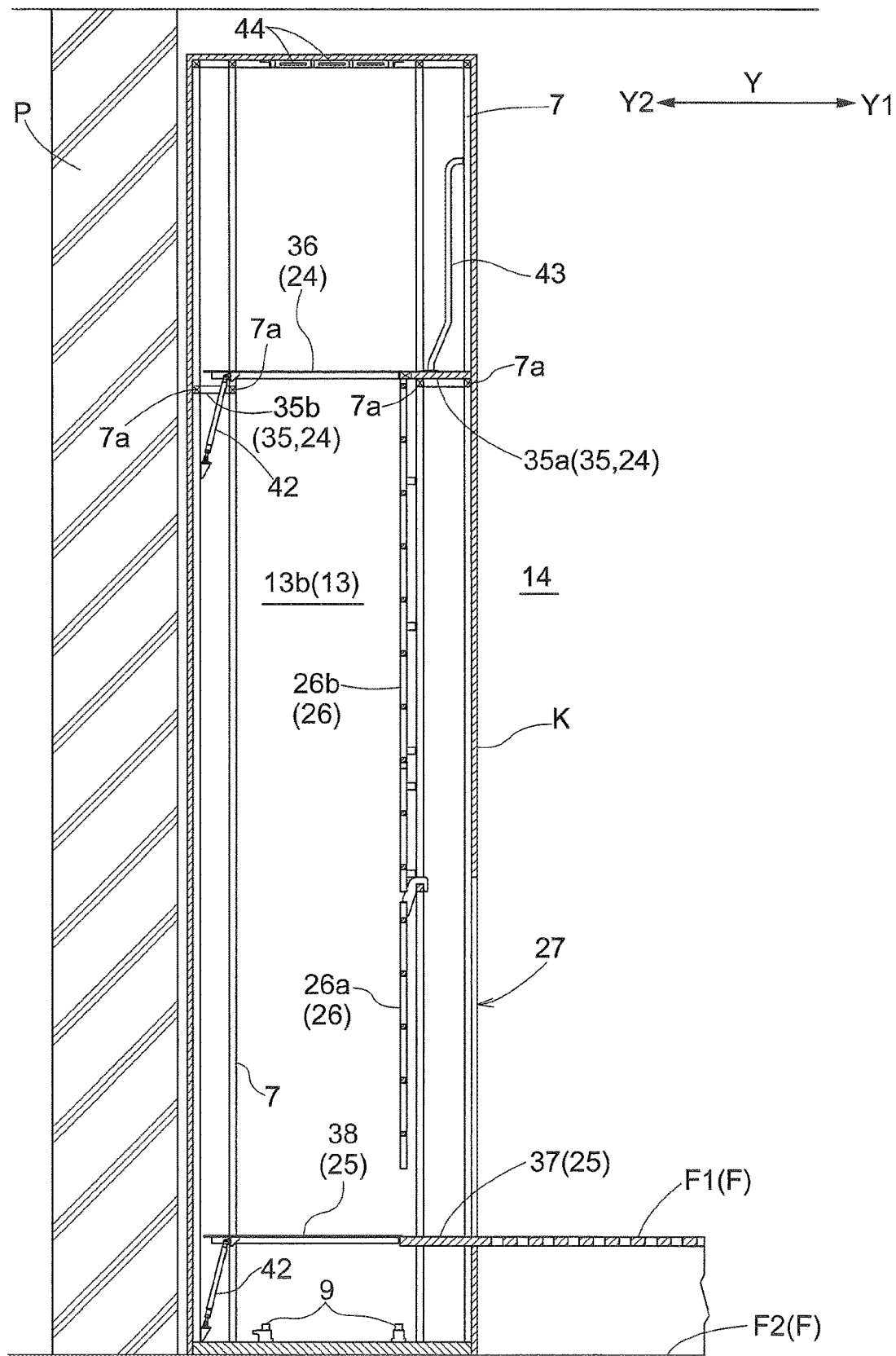
FIG. 5 is a front view of the out-of-the-way area of the article transport facility.
Figure 13:
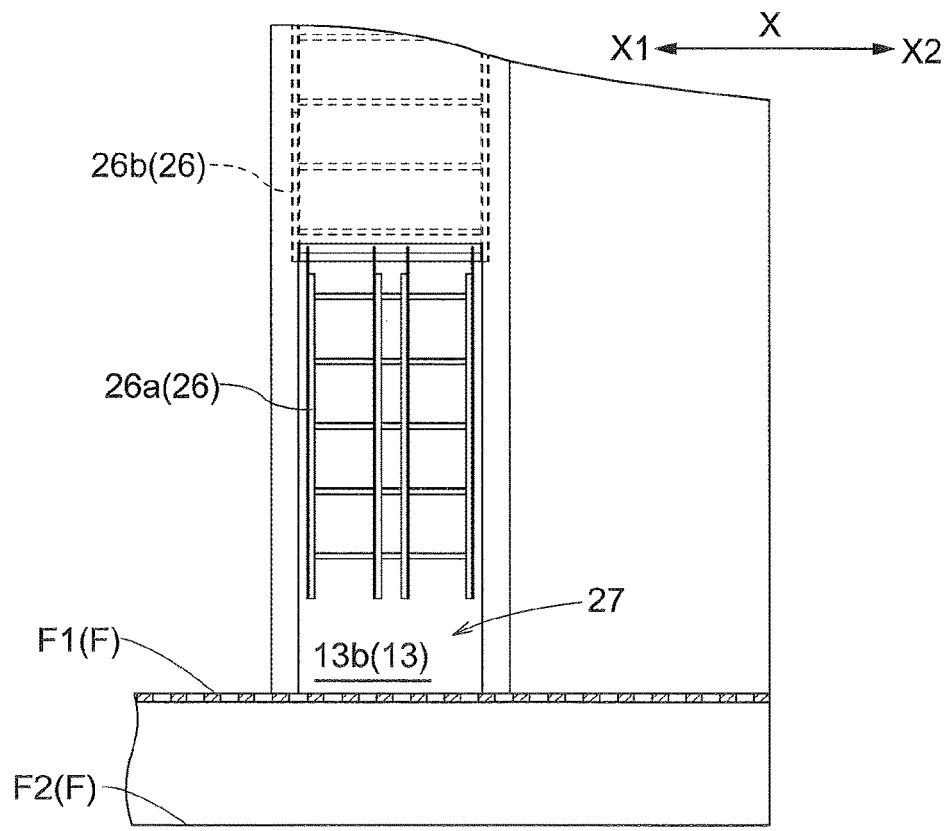
FIG. 13 is a side view of an out-of-the-way area of the article transport facility.

As shown in FIGS. 4, 5, and 13, an entrance 27 is formed in a wall or partition K, which a worker can use to move in and out between the external area 14 and the out-of-the-way area 13b of the interior area 13. The worker can enter the out-of-the-way area 13b of the interior area 13 through this entrance 27.

This entrance 27 is formed in the wall K such that that its lower end is at the same height as the top surface of the upper floor F1.

As shown in FIGS. 4 and 5, provided in the out-of-the-way area 13b are an upper work platform 24 which a worker can get onto, and a lower work platform 25 which is provided at a lower height than the upper work platform 24 and which a worker can get onto, as with the upper work platform 24. Note that the upper work platform 24 is, or correspond to, the work platform.

The upper work platform 24 is provided at a higher position than the travel carriage 18 of the stacker crane 3 that has moved to, and is in, the out-of-the-way stop position S, and at a lower position than the upper end of the mast 19. The upper work platform 24 is provided at such a height that a worker who is on the upper work platform 24 can reach the top of the stacker crane 3 that has moved to, and is in, the out-of-the-way stop position S. In addition, the lower work platform 25 is provided at the same height as the upper floor F1 so that the top surface of the lower work platform 25 and the top surface of the upper floor F1 are at the same height.

Figure 6:
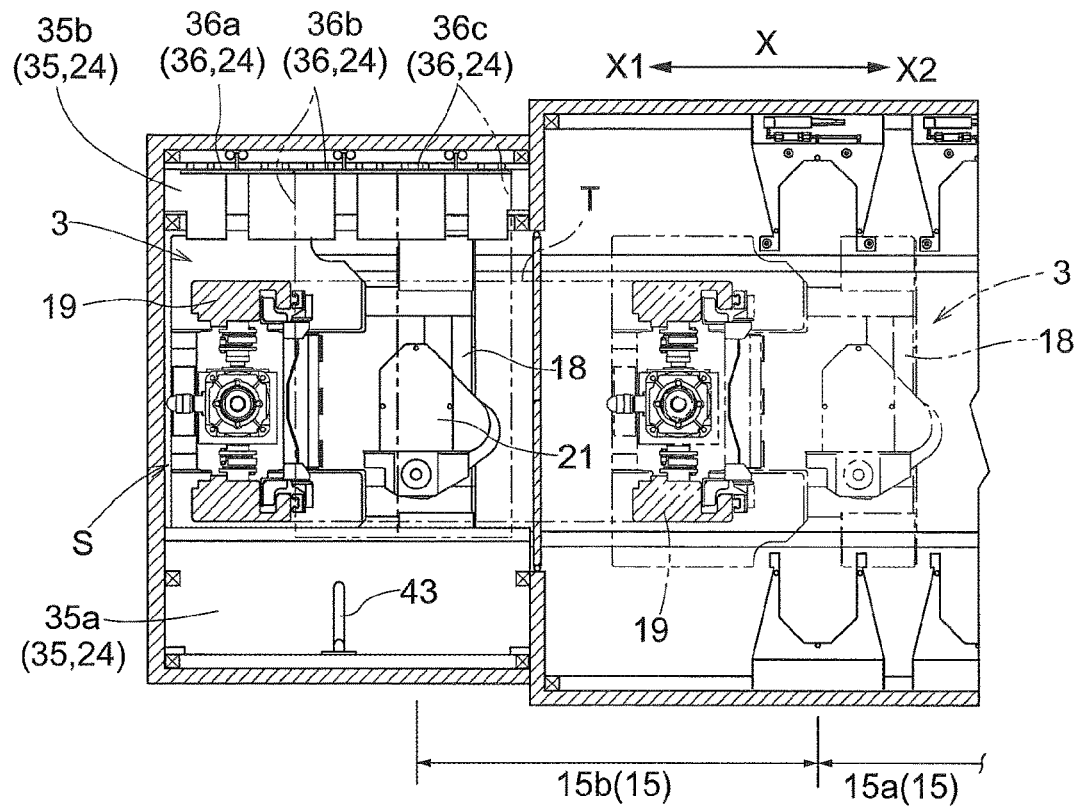
FIG. 6 shows a mast trajectory and an upper work platform.

The upper work platform 24 has upper fixed portions 35 which are out-of-trajectory portions with one such portion located on each side, along the lateral direction Y, of the mast trajectory T, and upper pivotable portions 36 which are in-trajectory portions a part of each of which is located within the mast trajectory T. As shown in FIG. 6, the mast trajectory T is a trajectory of the mast 19 in the out-of-the-way movement section 15b when the stacker crane 3 moves from the transporting movement section 15a to the out-of-the-way stop position S. More specifically, the mast trajectory T refers to a part of the trajectory of the mast 19 that is on the first moving direction X1 side of the partition wall 5 in its closed position.

The upper fixed portions 35 include a first upper fixed portion 35a which is located outside the mast trajectory T and on the first lateral direction Y1 side with respect to the mast trajectory T, and second upper fixed portions 35b which are located outside the mast trajectory T and on the second lateral direction Y1 side with respect to the mast trajectory T. Each of the first upper fixed portions 35a and the second upper fixed portions 35b is fixed to the framework 7.

With regard to the upper pivotable portions 36, at least a part of each of the upper pivotable portions 36 is located in the mast trajectory T when in its support attitude. And the upper pivotable portions 36 include a first upper pivotable portion 36a, a middle upper pivotable portion 36b, and a second upper pivotable portion 36c with one portion located next to another along the moving direction X. Each of the first upper pivotable portion 36a, the middle upper pivotable portion 36b, and the second upper pivotable portion 36c is pivotably connected to the framework 7. Each of the upper pivotable portions 36 is configured to be pivotable (movable) to its support attitude (which is, or corresponds to, the support position) in which its platform or support surface is horizontal and at least a part thereof is located within the mast trajectory T, and to an out-of-the-way attitude (which is, or corresponds to, the out-of-the-way position) in which it has been pivoted upward from its support attitude and is out of the mast trajectory T in the lateral direction Y. Note that, when something is described to be located in or within the mast trajectory T, it means that the something overlaps with the mast trajectory T in plan view.

The first upper fixed portion 35a is connected to at least a pair of horizontal frame members 7a of the framework 7 which are spaced apart from each other along the lateral direction Y, and is fixed thereto in such an attitude that the platform or support surface which a worker can get on is horizontal. The second upper fixed portions 35b and a lower fixed portion 37 are also connected to the corresponding pair of horizontal frame members 7a of the framework 7 (which is different from the horizontal frame members 7a to which the first upper fixed portion 35a is connected), and are fixed thereto in such an attitude that the platform or support surface which a worker can get on is horizontal.

The proximal end portion, on the second lateral direction Y2 side, of the first upper pivotable portion 36a is connected to the framework 7 so as to be pivotable about an axis extending along the moving direction X. The first upper pivotable portion 36a can be switched or moved to the support attitude and to the out-of-the-way attitude by pivoting it about this axis extending along the moving direction X.

And the proximal end portion of the first upper pivotable portion 36a is pivotably connected to the horizontal frame member 7a (of the pair of horizontal frame members 7a of the framework 7 to which the second upper fixed portions 35b are connected) that is located on the second lateral direction Y2 side. With the attitude of the first upper pivotable portion 36a switched or changed to the support attitude, the distal end portion of the first upper pivotable portion 36a is supported from below by the horizontal frame member (of the pair of horizontal frame members 7a to which the first upper fixed portion 35a is connected) that is located on the second direction side.

In addition, the first upper pivotable portion 36a is provided with an engaged portion 41 which engages an engaging member 40 when the first upper pivotable portion 36a is switched or moved to its out-of-the-way attitude. The engaged portion 41 engages the engaging member 40 as the first upper pivotable portion 36a is moved to the out-of-the-way attitude so that the first upper pivotable portion 36a is held in its out-of-the-way attitude. In addition, when the first upper pivotable portion 36a in its out-of-the-way attitude, its platform or support surface is tilted toward the second lateral direction Y2 relative to its vertical attitude so that the first upper pivotable portion 36a is pushed toward the engaging member 40 by its own weight. And, by moving the first upper pivotable portion 36a from the out-of-the-way attitude toward the support attitude, the moving or operating force causes the engaging member 40 to be deformed elastically with the result that the engaging of the engaged portion 41 by the engaging member 40 is released. In addition, a gas spring 42, for assisting such attitude changing operation of the first upper pivotable portion 36a, is connected to the first upper pivotable portion 36a.

In addition, detailed description for the middle upper pivotable portion 36b and the second upper pivotable portion 36c is omitted in light of the fact that they are also connected to the framework 7 in a manner similar to the manner in which the first upper pivotable portion 36a is connected to the framework 7. Incidentally, each of the middle upper pivotable portion 36b and the second upper pivotable portion 36c is provided with a engaged portion 41. And a separate gas spring 42 is provided to and connected to each of the middle upper pivotable portion 36b and the second upper pivotable portion 36c.

The lower work platform 25 includes a lower fixed portion 37 which is located outside the mast trajectory T and on the first lateral direction Y1 side with respect to the mast trajectory T, and lower pivotable portions 38 at least a part of each of which is located in the mast trajectory T.

The lower fixed portion 37 is located only on the first lateral direction Y1 side with respect to the mast trajectory T, and is fixed to the framework 7.

The lower pivotable portions 38 include a first lower pivotable portion 38a, and a second lower pivotable portion 38b which are located next to each other along the moving direction X. Each of the first lower pivotable portions 38a and the second lower pivotable portion 38b is configured to be pivotable (movable) to its support attitude (which is, or corresponds to, the support position) in which its platform or support surface is horizontal and to an out-of-the-way attitude (which is, or corresponds to, the out-of-the-way position) in which it has been pivoted upward from its support attitude.

Detailed description is omitted for the first lower pivotable portion 38a and the second lower pivotable portion 38b because the basic structure of these portions 38a and 38b is the same as that of the first upper pivotable portion 36a, etc., although the horizontal frame members 7a to which respective proximal end portions are connected and the horizontal frame members 7a which support the distal end portions in their support attitudes are different from the horizontal frame members 7a for the first upper pivotable portion 36a, etc.

The locations of the upper pivotable portions 36 of the upper work platform 24 and the locations of the lower pivotable portions 38 of the lower work platform 25 are described further next. In the description below, a reversed stacker crane 3R is assumed to exist in addition to the normal stacker crane 3. The reversed stacker crane 3R is a stacker crane 3 which can be installed in the article transport facility and for which the front side and back side are reversed with respect to those of the normal stacker crane 3 so that the front side and back side correspond, respectively, to the back side and the front side of the normal stacker crane 3. Thus, in the normal stacker crane 3, its mast 19 is arranged vertically at a location that is offset in the first moving direction X1 from the center of the travel carriage 18 along the moving direction X. In contrast, in the reversed stacker crane 3, its mast 19 is arranged vertically at a location that is offset in the second moving direction X2 from the center of the travel carriage 18 along the moving direction X.

Incidentally, when describing the upper pivotable portions 36 of the upper work platform 24 and the lower pivotable portions 38 of the lower work platform 25, a description is provided about the reversed stacker crane 3R being at rest in the out-of-the-way stop position S assuming that the reversed stacker crane 3R can move in the movement sections 15. However, the reversed stacker crane 3R does not have to be actually provided to the article transport facility.

Note that the normal stacker crane 3 is, or correspond to, the first article transport device, and the reversed stacker crane 3R is, or correspond to the second article transport device. And the travel carriage 18, the mast 19, and the vertically movable member 20 of this reversed stacker crane 3R are, or correspond to, the second travel carriage, the second mast, and the second vertically movable member respectively.

As described above, in addition to the upper fixed portions 35, the upper work platform 24 includes the first upper pivotable portion 36a, the middle upper pivotable portion 36b, and the second upper pivotable portion 36c with one portion located next to another along the moving direction X.

Figure 8:
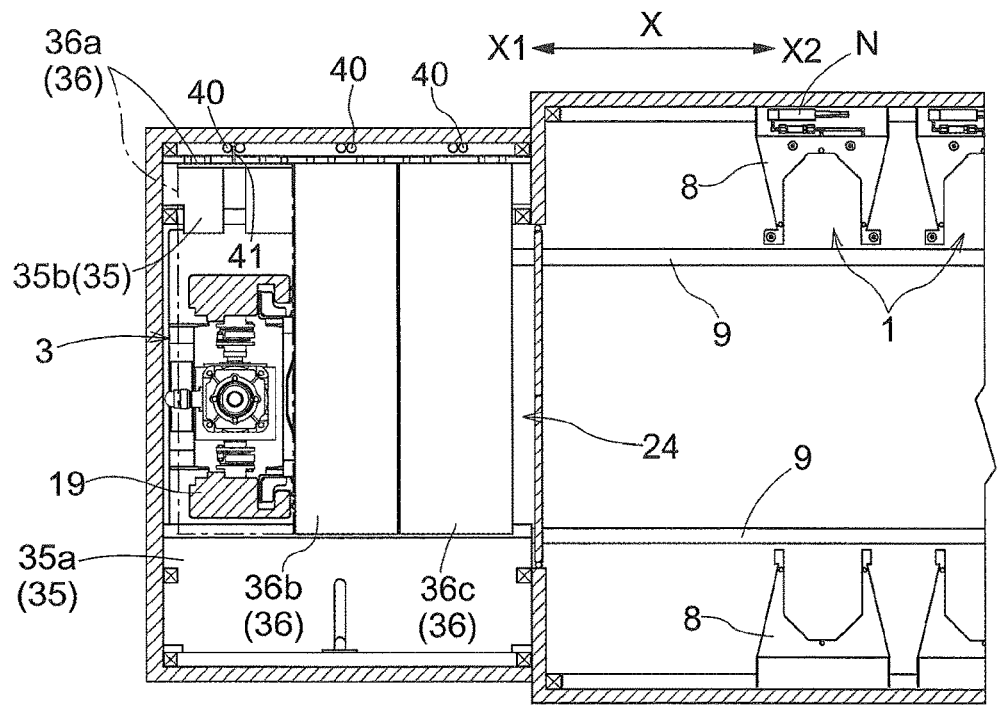
FIG. 8 is a plan view showing a state in which only a first upper pivotable portion of the three upper pivotable portions has been moved to its out-of-the-way attitude.
Figure 9:
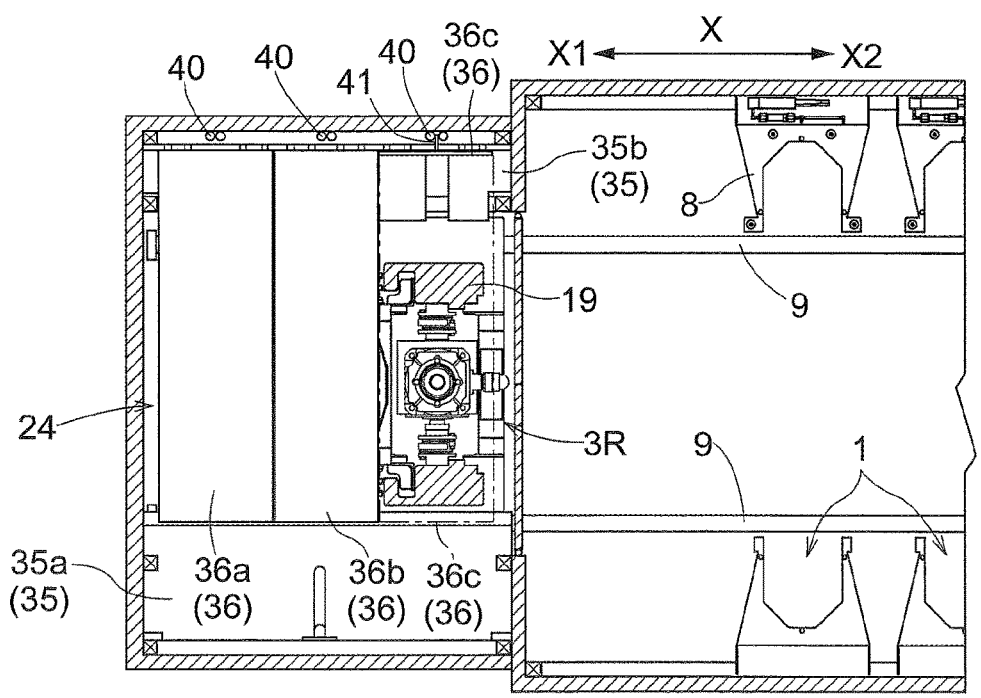
FIG. 9 is a plan view showing a state in which only a second upper pivotable portion of the three upper pivotable portions has been moved to its out-of-the-way attitude.

The middle upper pivotable portion 36b is located, in plan view, at a position between an area in which the mast 19 of the stacker crane 3 is located when the stacker crane 3 has moved to, and is in, the out-of-the-way stop position S and an area in which the mast 19 of the reversed stacker crane 3R would be if the reversed stacker crane 3R was in the out-of-the-way stop position S (see FIG. 8 together with FIG. 9).

The first upper pivotable portion 36a is located on the first moving direction X1 side of, and adjacent, the middle upper pivotable portion 36b. The first upper pivotable portion 36a is located, in plan view, at a position that would be on the first moving direction X1 side with respect to the mast 19 of the reversed stacker crane 3R if the reversed stacker crane 3R was in the out-of-the-way stop position S and that would overlap with the area in which the mast 19 of the stacker crane 3 is located when the stacker crane 3 has moved to, and is in, the out-of-the-way stop position S (see FIG. 8).

The second upper pivotable portion 36c is located on the second moving direction X2 side of, and adjacent, the middle upper pivotable portion 36b. The second upper pivotable portion 36c is located, in plan view, at a position that is on the second moving direction X2 side with respect to the mast 19 of the stacker crane 3 when the stacker crane 3 has moved to, and is in, the out-of-the-way stop position S and that would overlap with the area in which the mast 19 of the reversed stacker crane 3R would be if the reversed stacker crane 3R was in the out-of-the-way stop position S (see FIG. 9).

Incidentally, the middle upper pivotable portion 36b and the second upper pivotable portion 36c are, or correspond to, the in-trajectory portions which are located in an area within the mast trajectory T that excludes the area in which the mast 19 is located when the stacker crane 3 is in the out-of-the-way stop position S.

Figure 7:
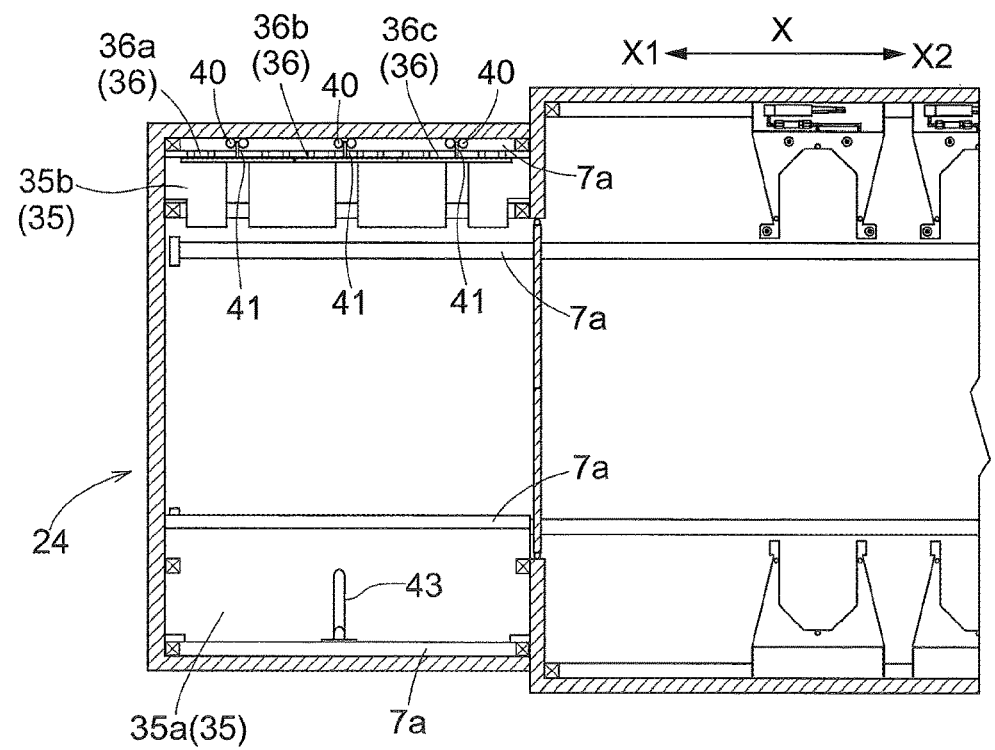
FIG. 7 is a plan view showing a state in which all of three upper pivotable portions have been moved to their respective out-of-the-way attitudes.

Thus, the upper pivotable portion 36 (the first upper pivotable portion 36a, the middle upper pivotable portion 36b, and the second upper pivotable portion 36c) can be switched, or moved, to their respective positions shown in FIGS. 7, 8, and 9.

In other words, as shown in FIG. 7, all of the first upper pivotable portion 36a, the middle upper pivotable portion 36b, and the second upper pivotable portion 36c which make up the upper pivotable portions 36 can be switched, or moved, to their respective out-of-the-way attitudes.

And, as shown in FIG. 8, when the stacker crane 3 has moved to and is in the out-of-the-way stop position S, the middle upper pivotable portion 36b and the second upper pivotable portion 36c of the upper pivotable portions 36 are located on the second moving direction X2 side of the mast 19 of the stacker crane 3; thus, these middle upper pivotable portion 36b and the second upper pivotable portion 36c can be switched, or moved, to their respective support attitudes from the out-of-the-way attitudes. Note that the middle upper pivotable portion 36b and the second upper pivotable portion 36c are provided as in-trajectory portions which are located in an area within the mast trajectory T that excludes the area in which the mast 19 is located when the stacker crane 3 is in the out-of-the-way stop position S.

In addition, as shown in FIG. 9, if the reversed stacker crane 3R had moved to and was in the out-of-the-way stop position S, the middle upper pivotable portion 36b and the first upper pivotable portion 36b of the upper pivotable portions 36 would be located on the first moving direction X1 side of the mast 19 of the reversed stacker crane 3R; thus, these middle upper pivotable portion 36b and the first upper pivotable portion 36a can be switched, or moved, to their respective support attitudes from the out-of-the-way attitudes.

Incidentally, when or if neither the stacker crane 3 nor the reversed stacker crane 3R has moved to, and is in, the out-of-the-way stop position S, all of the first upper pivotable portion 36a, the middle upper pivotable portion 36b, and the second upper pivotable portion 36c can be switched, or moved, to their respective support attitudes.

Also, as described above, in addition to the lower fixed portion 37, the lower work platform 25 includes the first lower pivotable portion 38a, and the second lower pivotable portion 38b.

Figure 11:
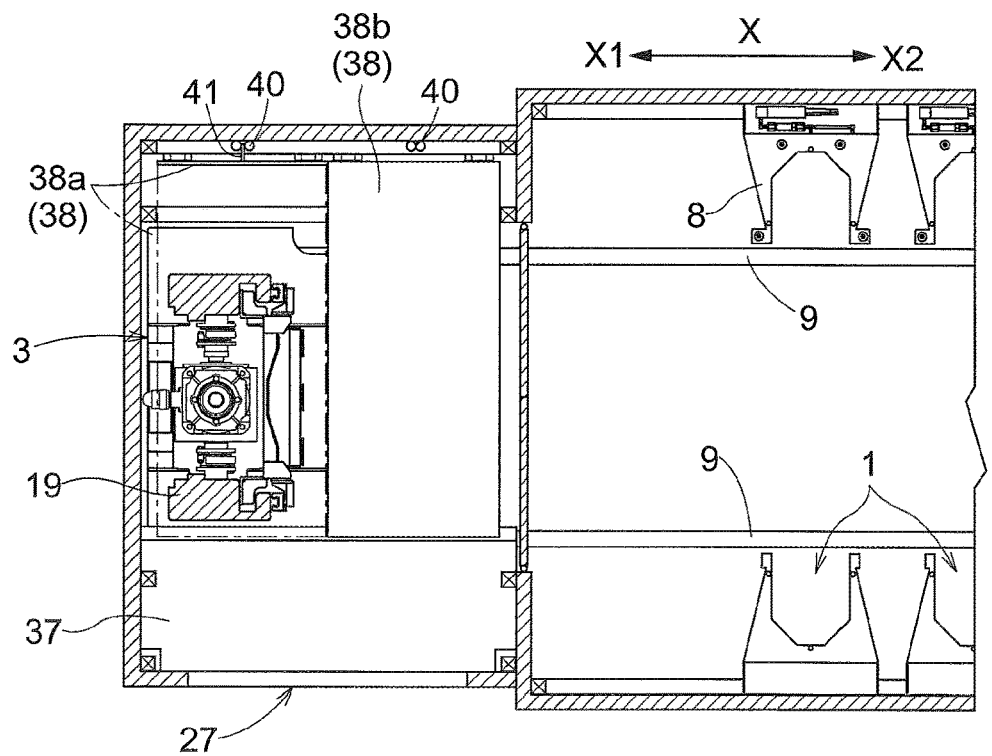
FIG. 11 is a plan view showing a state in which only a first lower pivotable portion of the two lower pivotable portions has been moved to its out-of-the-way attitude.
Figure 12:
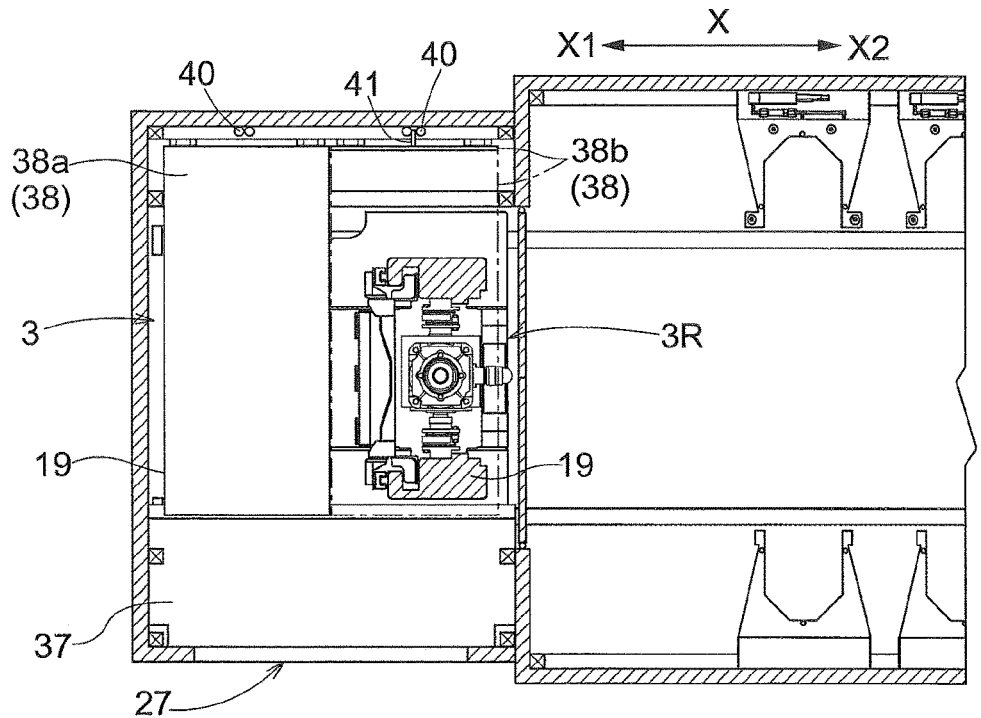
FIG. 12 is a plan view showing a state in which only a second lower pivotable portion of the two lower pivotable portions has been moved to its out-of-the-way attitude.

The first lower pivotable portion 38a is located, in plan view, at a position that would be on the first moving direction X1 side with respect to the mast 19 of the reversed stacker crane 3R if the reversed stacker crane 3R was in the out-of-the-way stop position S and that overlaps with the area in which the mast 19 of the stacker crane 3 is located when the stacker crane 3 has moved to, and is, in the out-of-the-way stop position S (see FIG. 11 together with FIG. 12).

The second lower pivotable portion 38b is located on the second moving direction X2 side of, and adjacent, the first lower pivotable portion 38a. The second lower pivotable portion 38b is located, in plan view, at a position that is on the second moving direction X2 side with respect to the mast 19 of the stacker crane 3 when the stacker crane 3 has moved to, and is in, the out-of-the-way stop position S and that would overlap with the area in which the mast 19 of the reversed stacker crane 3R would be located if the reversed stacker crane 3R had moved to, and was in, the out-of-the-way stop position S (see FIG. 11 together with FIG. 12).

Incidentally, the second lower pivotable portion 38b is, or correspond to, the second work platform which is located in an area within the mast trajectory T that excludes the area in which the mast 19 is located when the stacker crane 3 is in the out-of-the-way stop position S and which is configured to be capable of being moved to its support position and to its out-of-the-way position.

Figure 10:
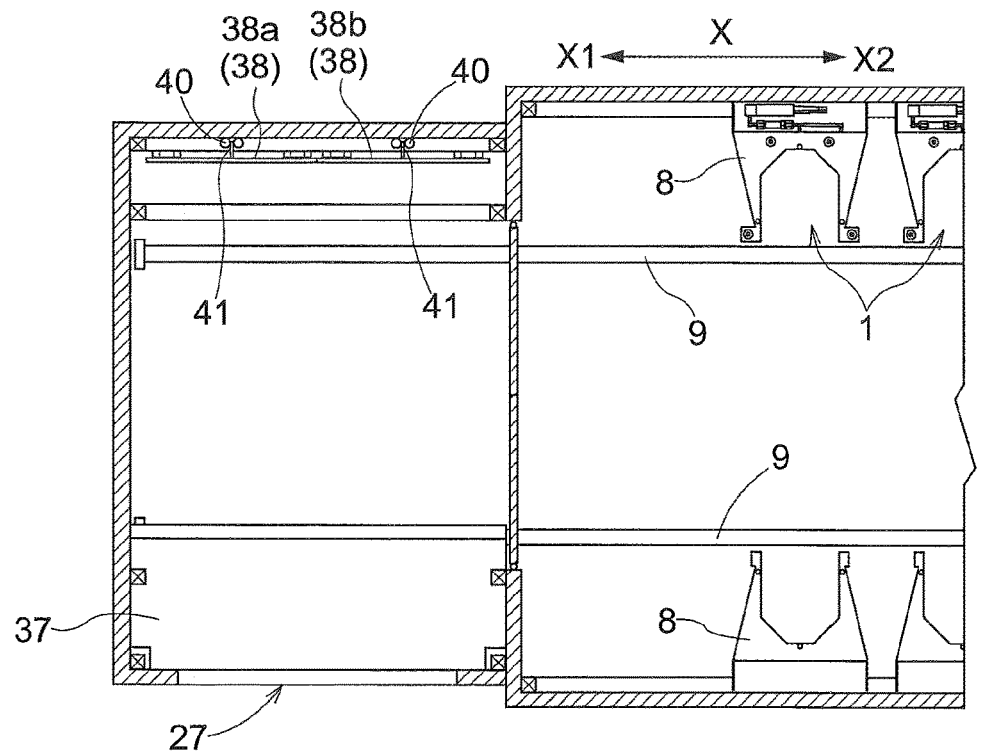
FIG. 10 is a plan view showing a state in which both of the two lower pivotable portions have been moved to their respective out-of-the-way attitudes.

Thus, the lower pivotable portion 38 (the first lower pivotable portion 38a, and the second lower pivotable portion 38b) can be switched, or moved, to their respective positions shown in FIGS. 10, 11, and 12.

In other words, as shown in FIG. 10, both of the first lower pivotable portion 38a, and the second lower pivotable portion 38b of the lower pivotable portions 38 can be switched, or moved, to their respective out-of-the-way attitudes.

And, as shown in FIG. 11, when the stacker crane 3 has moved to, and is in, the out-of-the-way stop position S, the second lower pivotable portion 38b of the lower pivotable portions 38 is located on the second moving direction X2 side of the mast 19 of the stacker crane 3; thus, the second lower pivotable portion 38b can be switched, or moved, to its support attitude from its out-of-the-way attitude.

In addition, as shown in FIG. 12, when the reversed stacker crane 3R had moved to, and was in, the out-of-the-way stop position S, the first lower pivotable portion 38a of the lower pivotable portions 38 would be located on the first moving direction X1 side of the mast 19 of the reversed stacker crane 3R; thus, the first lower pivotable portion 38a can be switched, or moved, to its support attitude from its out-of-the-way attitude.

Incidentally, when neither the stacker crane 3 nor the reversed stacker crane 3R has moved to, and is in, the out-of-the-way stop position S, both of the first lower pivotable portion 38a, and the second lower pivotable portion 38b can be switched, or moved, to their respective support attitudes.

As shown in FIG. 4 (see also FIG. 6), a ladder 26 is installed between the mast trajectory T on one hand and the first upper fixed portion 35a and the entrance 27 on the other hand along the lateral direction Y such that the ladder extends vertically.

And, as shown in FIG. 13, the entrance 27 is formed in the portion of a wall (or a partition) K that covers, or is located on, the first lateral direction Y1 side of the out-of-the-way area 13b. In addition, this entrance 27 is formed in the portion of the wall K that is at a lower height than the upper work platform 24, and that overlaps with the ladder 26 as seen along the lateral direction Y.

The ladder 26 has a broad width along the moving direction X. Thus, the ladder is so formed that a worker can climb up to, and down from, the first upper fixed portion 35a using the second moving direction X2 side portion of the ladder 26 even when the stacker crane 3 is at rest in the out-of-the-way stop position S, or when only the first upper pivotable portion 36a is switched or moved to the support attitude. And the ladder is so formed that a worker can climb up to, and down from, the first upper fixed portion 35a using the first moving direction X1 side portion of the ladder 26 even when the reversed stacker crane 3R was at rest in the out-of-the-way stop position S, or when only the second upper pivotable portion 36c is switched or moved to the support attitude.

As shown in FIGS. 5 and 13, the ladder 26 has a lower ladder portion 26a located at the same height as the entrance 27, and an upper ladder portion 26b located higher than (i.e., above) the entrance 27.

And the lower ladder portion 26a is configured such that it can be placed in its in-use position at which the ladder 26 overlaps with the entrance 27 as seen along the lateral direction Y and such that it can be removed from the in-use position.

A handrail 43 is installed at a position that is higher than the upper work platform 24 and that is lower than the wall K forming the ceiling portion. The handrail 43 is so located that it overlaps with the upper work platform 24 in plan view.

The handrail 43 is formed by a frame member that generally extends vertically. And the handrail 43 is shaped such that its lower portion gradually bulges further toward the mast trajectory T to make it easy for a worker to grasp the handrail 43 when getting onto the first upper fixed portion 35a from the ladder 26 and when getting down from the first upper fixed portion 35a to the ladder 26.

In addition, the handrail 43 is connected to the framework 7 to be pivotably about an axis that extends along the vertical direction, and is configured to be switched or moved to an in-use attitude in which the handrail 43 extends along the lateral direction Y as shown in FIG. 7, and to a stow-away attitude (not shown) in which the handrail 43 extends along the moving direction X.

Handles 44, which a worker can hold for support when moving on the upper work platform 24, are fixed to a portion of the framework 7 that is located in the out-of-the-way area 13b. The handles 44 are provided above the trajectory of the stacker crane 3.

As shown in FIG. 2, the out-of-the-way area 13b is defined to be located to one side, along the lateral direction Y, of a column P of the building. This column P of the building projects out along the first lateral direction Y1 with respect to the wall A of the building. Thus, the portion of the out-of-the-way area 13b that is located to the second lateral direction Y2 side with respect to the mast trajectory T is formed narrower along the lateral direction than the portion of the out-of-the-way area 13b that is located to the first lateral direction Y1 side.

In addition, the length, along the moving direction X, of the out-of-the-way area 13b is approximately 10% to 20% longer than the length, along the moving direction X, of the stacker crane 3. The upper work platform 24 and the lower work platform 25 are formed to be so dimensioned that each extends over the full length, along the moving direction X, and the full width, along the lateral direction Y, of the out-of-the-way area 13b.

In addition, an area of the out-of-the-way area 13b, that is generally rectangular in shape in plan view and that is located between the first upper fixed portion 35a and the second upper fixed portion 35b, is longer along the moving direction X than along the lateral direction Y. Further, within this area, each area in which corresponding one of the first upper pivotable portion 36a, the middle upper pivotable portion 36b, and the second upper pivotable portion 36c is placed when in the support attitude, is longer along the lateral direction Y than along the moving direction X.

Thus, when, for example, a maintenance work, etc. on an upper portion of the mast 19 needs to be performed, the stacker crane 3 can be moved from the transporting movement section 15a to the out-of-the-way stop position S in the out-of-the-way movement section 15b, by switching or moving each of the first upper pivotable portion 36a, the middle upper pivotable portion 36b, the second upper pivotable portion 36c, the first lower pivotable portion 38a, and the second lower pivotable portion 38b to its out-of-the-way attitude. And after moving the stacker crane 3 to the out-of-the-way stop position S, the middle upper pivotable portion 36b, the second upper pivotable portion 36c, and the second lower pivotable portion 38b are switched or moved to their respective support attitudes. This allows a worker to get onto the upper fixed portions 35 as well as the middle upper pivotable portion 36b and the second upper pivotable portion 36c of the upper pivotable portions 36 as far as the upper work platform 24 is concerned, and allows a worker to get onto the lower fixed portion 37 as well as the second lower pivotable portion 38b of the lower pivotable portions 38 as far as the lower work platform 25 is concerned.

In addition, a similar operation can be performed for the reversed stacker crane 3R if and when it is installed. More specifically, after moving the reversed stacker crane 3R to the out-of-the-way stop position S, the middle upper pivotable portion 36b, the first upper pivotable portion 36a, and the first lower pivotable portion 38a are switched or moved to their respective support attitudes. This allows a worker to get onto the upper fixed portions 35 as well as the middle upper pivotable portion 36b and the first upper pivotable portion 36a of the upper pivotable portions 36 as far as the upper work platform 24 is concerned, and allows a worker to get onto the lower fixed portion 37 as well as the first lower pivotable portion 38a of the lower pivotable portions 38 as far as the lower work platform 25 is concerned.

As such, by providing the first upper pivotable portion 36a, the middle upper pivotable portion 36b, and the second upper pivotable portion 36c each of whose attitude can be switched, or changed, to its support attitude and to its out-of-the-way attitude, movement of the stacker crane 3 in the out-of-the-way movement section 15b is unhindered in the out-of-the-way attitudes, and in addition, when performing a maintenance work, a worker can use one or more of the pivotable portions 36a, 36b, and 36c that have been moved to their respective support attitudes in addition to the upper fixed portions 35 to perform the work with improved efficiency and ease. Since each of the pivotable portions 36a, 36b, and 36c in its support attitude is located in the mast trajectory T, the amount of any increase in the floor space which the facility occupies can be reduced while improving efficiency and ease with which a maintenance work can be performed as described above.

ALTERNATIVE EMBODIMENTS (1) In the embodiment described above, the transporting movement section 15a is set up only on one side, along the moving direction X, with respect to the out-of-the-way movement section 15b. However, one transporting movement section 15a may be provided on each side, along the moving direction X, with respect to the out-of-the-way movement section 15b. More specifically, such arrangements may be made as follows.

Figure 14:
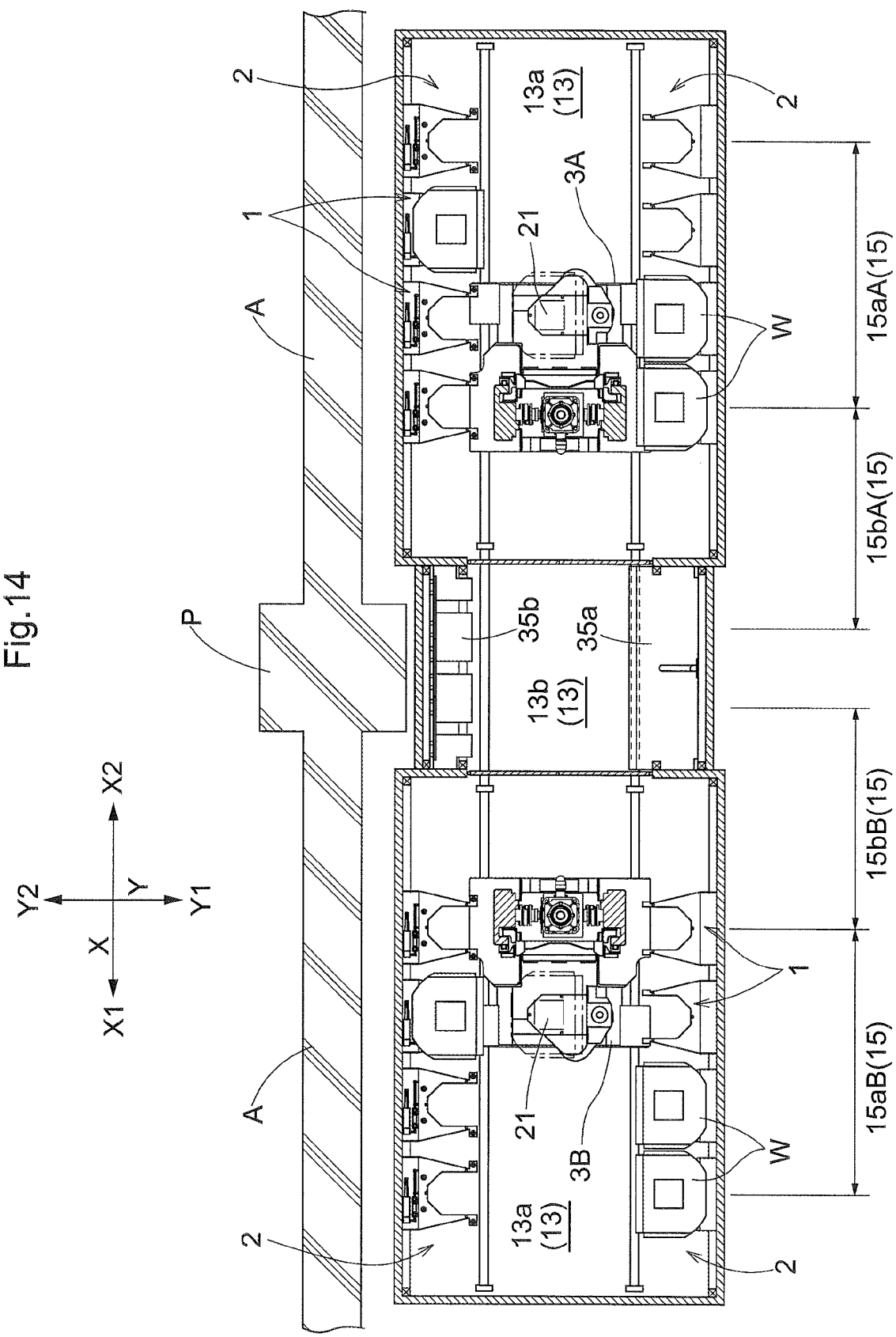
FIG. 14 is a plan view of an article transport facility of the alternative embodiment (1).

As shown in FIG. 14, the movement sections 15 include a first transporting movement section 15aA in which a first stacker crane 3A moves when it transports an article, a second transporting movement section 15aB in which a second stacker crane 3B moves when it transports an article, a first out-of-the-way movement section 15bA in which the first stacker crane 3A moves when it moves out of the first transporting movement section 15aA to the out-of-the-way stop position S (location indicated with 13b), and a second out-of-the-way movement section 15bB in which the second stacker crane 3B moves when it moves out of the second transporting movement section 15aB to the out-of-the-way stop position S.

The first transporting movement section 15aA is set up on the second moving direction X2 side with respect to the first out-of-the-way movement section 15bA and the second out-of-the-way movement section 15bB whereas the second transporting movement section 15aB is set up on the first moving direction X1 side with respect to the first out-of-the-way movement section 15bA and the second out-of-the-way movement section 15bB.

The first out-of-the-way movement section 15bA and the second out-of-the-way movement section 15bB are located between the first transporting movement section 15aA and the second transporting movement section 15aB. The first out-of-the-way movement section 15bA is continuous with the first transporting movement section 15aA whereas the second out-of-the-way movement section 15bB is continuous with the second transporting movement section 15aB.

FIG. 14 shows respective extents of the first transporting movement section 15aA, the second transporting movement section 15aB, the first out-of-the-way movement section 15bA, and the second out-of-the-way movement section 15bB in terms of the position of the center, along the moving direction X, of the transfer device 21. Thus, although the first out-of-the-way movement section 15bA and second out-of-the-way movement section 15bB do not overlap with each other, an extent of a space occupied by the first stacker crane 3A at rest in the out-of-the-way stop position S, and an extent of a space occupied by the second stacker crane 3B at rest in the out-of-the-way stop position S would overlap with each other along the moving direction X. More specifically, the position of the center, along the moving direction X, of the first stacker crane 3A at rest in the out-of-the-way stop position S, is at the same location, along the moving direction X, as the position of the center, along the moving direction X, of the second stacker crane 3B at rest in the out-of-the-way stop position S. Thus, the out-of-the-way stop position S of the first stacker crane 3A and the out-of-the-way stop position S of the second stacker crane 3B can be said to be set up at the same position.

In addition, the first out-of-the-way movement section 15bA and the second out-of-the-way movement section 15bB may be set up such that the first moving direction X1 side end of the first out-of-the-way movement section 15bA and the second moving direction X2 side end of the second out-of-the-way movement section 15bB are at the same position along the moving direction X. In addition, the first out-of-the-way movement section 15bA and the second out-of-the-way movement section 15bB may be set up such that they have portions that overlap with each other. And the movement sections 15 (the transporting movement section 15a and the out-of-the-way movement section 15b) may be set up in terms of the position of the mast 19, etc. As such, the position that is used as the location of the stacker crane 3 may be changed suitably.

As with the stacker crane 3 of the embodiment described above, the first stacker crane 3A may have a travel carriage 18, a mast 19, a vertically movable member 20, and a transfer device 21 such that its mast 19 is arranged vertically at a location that is offset in the first moving direction X1 from the center of the travel carriage 18 along the moving direction X.

As with the reversed stacker crane 3R of the embodiment described above, the second stacker crane 3B may have a travel carriage 18, a mast 19, a vertically movable member 20, and a transfer device 21 such that its mast 19 is arranged vertically at a location that is offset in the second moving direction X2 from the center of the travel carriage 18 along the moving direction X.

(2) In the embodiment described above, one stacker crane 3 is installed in the transporting movement section 15a; however, two or more stacker cranes 3 may be installed in the transporting movement section 15a.

More specifically, when two stacker cranes 3 are allowed to move in the transporting movement section 15a, two transporting movement sections, namely, one side transporting movement section and the other side transporting movement section, are formed in the transporting movement section 15a and along the moving direction X. And one stacker crane 3 may be allowed to move in the one side transporting movement section whereas the other stacker crane 3 may be allowed to move in the other side transporting movement section. Note that the one side transporting movement section and the other side transporting movement section may be defined such that they do not overlap with each other along the moving direction X. Alternatively, the one side transporting movement section and the other side transporting movement section may be defined such that they overlap with each other along the moving direction X. In addition, one of the two stacker cranes 3 may be a reversed stacker crane 3R.

(3) In the embodiment described above, the upper pivotable portions 36 include three pivotable portions, namely, the first upper pivotable portion 36a, the middle upper pivotable portion 36b, and the second upper pivotable portion 36c. However, the upper pivotable portions 36 may include only two pivotable portions (for example, the middle upper pivotable portion 36b and the second upper pivotable portion 36c), as in the case of the lower pivotable portions 38. In addition, the upper pivotable portions 36 may include four or more pivotable portions. Or the upper pivotable portion may have only one portion by using one of the middle upper pivotable portion 36b and the second upper pivotable portion 36c.

In addition, the lower pivotable portions 38 include two pivotable portions, namely, the first lower pivotable portion 38a and the second lower pivotable portion 38b in the embodiment described above. However, as with the upper pivotable portion 36, the lower pivotable portions 38 may include, three, or four or more pivotable portions. In addition, the lower pivotable portion 38 may include only one pivotable portion by using the second lower pivotable portion 38b etc.

(4) In the embodiment described above, one upper fixed portion 35 is installed on each side, along the lateral direction Y, with respect to the mast trajectory T. However, an upper fixed portion 35 may be installed only on one side, along the lateral direction Y, with respect to the mast trajectory T.

The lower fixed portion 37 is installed only on one side, along the lateral direction Y, with respect to the mast trajectory T in the embodiment described above. However, one lower fixed portion 37 may be installed on each side, along the lateral direction Y, with respect to the mast trajectory T.

(5) In the embodiment described above, the middle upper pivotable portion 36b and the second upper pivotable portion 36c as the in-trajectory portions, as well as the second lower pivotable portion 38b as a second work platform, are all configured to be pivotable about respective axes extending along the moving direction X to their respective out-of-the-way attitudes and to their respective support attitudes. However, these pivotable portions may be configured to be pivotable about respective vertical axes or horizontally movable to their respective out-of-the-way attitudes and to their respective support attitudes. Likewise, the first upper pivotable portion 36a and the first lower pivotable portion 38a may be configured to be pivotable about respective vertical axes or horizontally movable to their respective out-of-the-way attitudes and to their respective support attitudes.

(6) In the embodiment described above, the ladder 26 is installed between the mast trajectory T and the first upper fixed portions 35a as the out-of-trajectory portion along the lateral direction Y. However, the ladder 26 may be installed directly below the second lateral direction Y2 side end of the first upper fixed portions 35a, or may be installed outside the wall K and adjacent, on the first lateral direction Y1 side, to the first upper fixed portion 35a, among other places. As such, the location of the ladder 26 may be changed suitably.

In addition, the lower ladder portion 26a may be so located that it would not overlap with the entrance 27 as seen along the lateral direction. When, for example, the lower ladder portion 26a does not overlap with the entrance 27 as seen along the lateral directional or when the lower ladder portion 26a would not likely be an obstacle to a worker moving in and out the entrance 27 even when the lower ladder portion 26a does overlap with the entrance 27, then the lower ladder portion 26a does not have to be removable.

(7) In the embodiment described above, the mast 19 is arranged vertically only at a location that is offset in the first moving direction X1 (or in the second moving direction X2) from the center of the travel carriage 18 along the moving direction X. However, the mast 19 may be arranged vertically only at the center of the travel carriage 18 along the moving direction X. Alternatively, two masts 19 may be arranged vertically with one mast 19 located at a location that is offset in the first moving direction X1 and the other mast 19 located at a location that is offset in the second moving direction X2, from the center of the travel carriage 18 along the moving direction X. As such, the location or locations in the travel carriage 18 at which the mast or masts 19 may be arranged vertically may be changed suitably.

(8) In the embodiment described above, the lower work platform 25 is provided at the same height as the upper floor F1; however, the lower work platform 25 may be provided at a height that is higher than the upper floor F1 and lower than the upper work platform 24. In addition, it is not necessary to provide the lower work platform 25 in the case in which the floor only which the article transport device moves and the floor on which a worker walks are located at the same height.

Outline of Embodiments

The arrangement of an article transport facility in accordance with the present invention is that the article transport facility comprises an article transport device capable of moving along a moving direction in movement sections to transport an article, wherein the movement sections include a transporting movement section in which the article transport device moves when transporting an article, and an out-of-the-way movement section which is continuous with the transporting movement section and in which the article transport device moves when moving out of the transporting movement section to an out-of-the-way stop position located outside the transporting movement section, wherein the article transport device includes a travel carriage capable of traveling along the moving direction, a mast arranged vertically on the travel carriage, a vertically movable member capable of being moved vertically and of supporting the article that is being transported.

A work platform which a worker can get onto is provided at a position that is higher than the travel carriage of the article transport device which has been moved to the out-of-the-way stop position, and that is lower than an upper end of the mast, wherein, with a lateral direction being defined to be a direction that intersects the moving direction in plan view, the work platform includes one or more out-of-trajectory portions which are located outside a mast trajectory which is a trajectory of the mast in the out-of-the-way movement section when the article transport device moves from the transporting movement section to the out-of-the-way stop position and which are located to at least one side, along the lateral direction, with respect to the mast trajectory, and one or more in-trajectory portions located in an area of the mast trajectory that excludes an area in which the mast is located when the article transport device is in the out-of-the-way stop position, and wherein each of the one or more in-trajectory portions is configured to be capable of being moved to a support position in which a corresponding one of the one or more in-trajectory portions is located in the mast trajectory, and to an out-of-the-way position in which the corresponding one of the one or more in-trajectory portions is out of the mast trajectory along the lateral direction.

With the arrangement described above, by moving each of the one or more in-trajectory portions of the work platform to its out-of-the-way position, the article transport device is allowed to move from the transporting movement section to the out-of-the-way stop position in the out-of-the-way movement section, and from the out-of-the-way stop position in the out-of-the-way movement section to the transporting movement section.

In addition, when each of the one or more in-trajectory portions of the work platform is in its support position, the one or more in-trajectory portions are not located in the area in which the mast, of the article transport device at rest in the out-of-the-way stop position, is located. Thus, with the article transport device at rest in the out-of-the-way stop position, each of the one or more in-trajectory portions of the work platform can be moved to its support position from its out-of-the-way position.

And by moving each of the one or more of the in-trajectory portions of the work platform to its support position with the article transport device at rest in the out-of-the-way stop position, a worker can get onto the work platform having both the one or more out-of-trajectory portions and the one or more in-trajectory portions, to perform a maintenance work on an upper portion of the article transport device with improved efficiency and ease. In addition, since the one or more of in-trajectory portions are located in the mast trajectory when in the support positions, the amount of any increase in the floor space, which the facility occupies when performing a maintenance work, can be reduced.

Thus, by so arranging that a part of the work platform can be placed in the mast trajectory by moving the position or positions of the one or more of the in-trajectory portions, movement of the article transport device in the out-of-the-way movement section is unhindered, and in addition, when performing a maintenance work, a worker can use the one or more in-trajectory portions in addition to the one or more out-of-the-trajectory portions to perform the work with improved efficiency and ease. In addition, the amount of any increase in the floor space, which the facility occupies when performing a maintenance work, can be reduced compared with a case in which the work platform of the same width consists only of out-of-trajectory portions.

Thus, this arrangement makes it easy to install a work platform which has a relatively large portion which a worker can get onto while reducing the amount of any increase in the floor space which the facility occupies.

Here, with a first direction being defined to be a direction along the moving direction and a second direction being defined to be a direction along the moving direction that is opposite from the first direction, the out-of-the-way movement section is preferably set up on a first direction side with respect to the transporting movement section, wherein a first article transport device, which is the article transport device, preferably has the mast which is arranged vertically at a location that is offset in the first direction from a center, along the moving direction, of the travel carriage, wherein a second article transport device preferably exists in addition to the first article transport device, the second article transport device being capable of moving in the movement sections, wherein the second article transport device preferably includes a second travel carriage capable of traveling along the moving direction, a second mast arranged vertically on the second travel carriage, a second vertically movable member capable of being moved vertically and of supporting an article that is being transported, wherein the second article transport device preferably has the second mast which is arranged vertically at a location that is offset in the second direction from a center, along the moving direction, of the second travel carriage, wherein, in addition to the one or more out-of-trajectory portions, the work platform preferably includes a middle work platform portion, a first work platform portion, and a second work platform portion with one portion located next to another along the moving direction, wherein each of the middle work platform portion, the first work platform portion, and the second work platform portion is preferably capable of being individually moved to the support position and to the out-of-the-way position, wherein a location in plan view in which the middle work platform portion is provided is preferably located between an area in which the mast of the first article transport device is located when the first article transport device is in the out-of-the-way stop position and an area in which the second mast of the second article transport device would be located if the second article transport device was in the out-of-the-way stop position, wherein a location in plan view in which the first work platform portion is provided preferably overlaps with an area in which the mast of the first article transport device is located when the first article transport device is in the out-of-the-way stop position, wherein a location in plan view in which the second work platform portion is provided preferably overlaps with an area in which the second mast of the second article transport device would be located if the second article transport device was in the out-of-the-way stop position, and wherein the middle work platform portion and the second work platform portion are preferably provided as the one or more in-trajectory portions.

With the arrangement described above, when the first article transport device is at rest in the out-of-the-way stop position, the middle work platform portion and the second work platform portion of the work platform are located on the second direction side with respect to the mast of the first article transport device; thus, the middle work platform portion and the second work platform portion can be moved from their respective out-of-the-way positions to their respective support positions. Thus, when the first article transport device is at rest in the out-of-the-way stop position, a worker can be on the out-of-trajectory portion, the middle work platform portion, and the second work platform portion of the work platform to perform work.

In addition, if the second article transport device is at rest in the out-of-the-way stop position, the middle work platform portion and the first work platform portion of the work platform would be located on the first direction side with respect to the mast of the second article transport device; thus, the middle work platform portion and the first work platform portion can be moved from their respective out-of-the-way positions to their respective support positions. Thus, if the second article transport device is at rest in the out-of-the-way stop position, a worker can be on the out-of-trajectory portion, the middle work platform portion, and the first work platform portion of the work platform to perform work.

Thus, by using the middle work platform portion both for when the first article transport device is at rest in the out-of-the-way stop position and for the case in which the second article transport device is at rest in the out-of-the-way stop position, a worker can perform a maintenance work on either of the first article transport device and the second article transport device, on the work platform with a relatively large surface area, with improved efficiency and ease.

In addition, a second article transport device is preferably provided in addition to a first article transport device which is the article transport device, the second article transport device being capable of moving in the movement sections, wherein the second article transport device preferably includes a second travel carriage capable of traveling along the moving direction, a second mast arranged vertically on the second travel carriage, a second vertically movable member capable of being moved vertically and of supporting an article that is being transported, wherein the movement sections preferably include a first transporting movement section which is the transporting movement section in which the first article transport device moves when transporting an article, a second transporting movement section in which the second article transport device moves when transporting an article, a first out-of-the-way movement section which is the out-of-the-way movement section in which the first article transport device moves when moving out of the first transporting movement section to the out-of-the-way stop position, and a second out-of-the-way movement section in which the second article transport device moves when moving out of the second transporting movement section to the out-of-the-way stop position, and wherein an extent of space occupied by the first article transport device when the first article transport device is in the out-of-the-way stop position preferably overlaps, along the moving direction, with an extent of space occupied by the second article transport device when the second article transport device is in the out-of-the-way stop position.

With the arrangement described above, the first article transport device moves in the first transporting movement section to transports an article whereas the second article transport device moves in the second transporting movement section to transports an article.

And an extent of space occupied by the first article transport device when the first article transport device is in the out-of-the-way stop position preferably overlaps, along the moving direction, with an extent of space occupied by the second article transport device when the second article transport device is in the out-of-the-way stop position. Thus, the floor space occupied by the facility can be made smaller compared with a case in which the out-of-the-way stop position for the first article transport device and the out-of-the-way stop position for the second article transport device are defined at different locations and are spaced apart from each other such that an extent of space occupied by the first article transport device when the first article transport device is in its out-of-the-way stop position would not overlap, along the moving direction, with an extent of space occupied by the second article transport device when the second article transport device is in its out-of-the-way stop position.

In addition, a vertically extending ladder is preferably located, along the lateral direction, between the mast trajectory on one hand, and one of the one or more out-of-trajectory portions of the work platform that is located on one side, along the lateral direction, with respect to the mast trajectory on the other hand.

With the arrangement described above, a worker can use the ladder to get onto the work platform. And since the ladder is located between the mast trajectory and the one or more of out-of-trajectory portions of the work platform, a worker can climb up and down the ladder using the space in which the mast trajectory is formed. Therefore, it is not necessary to provide a separate space for a worker to climb up and down the ladder. And even in case where such separate space is required, such space can be small. Thus, the article transport facility can be made relatively compact along the lateral direction.

In addition, a partition is preferably provided for partitioning an interior area, in which the article transport device, the work platform and the ladder are provided, from an external area outside the interior area, wherein an entrance for allowing a worker to enter the out-of-the-way movement section in the interior area from the external area is preferably formed in a portion of the partition that is at a position that is lower than the work platform and that overlaps with the ladder as seen along the lateral direction, wherein the ladder is preferably located, along the lateral direction, between the mast trajectory and the entrance formed in the partition, wherein the ladder preferably has a lower ladder portion located at the same height as the entrance and an upper ladder portion located above the entrance, and wherein the lower ladder portion is preferably configured to be capable of being located in an in-use position in which the lower ladder portion overlaps with the entrance as seen along the lateral direction, and of being removed from the in-used position.

With the arrangement described above, by removing the lower ladder portion from its in-use position, the ladder would not (or it makes it unlikely for the ladder to) get in the way of a worker when entering the interior area from the external area through the entrance. This arrangement makes it easier for a worker to move into the interior area from the external area through entrance. And the worker who entered the interior area can place the lower ladder portion in the in-use position so that the worker can climb up and down the ladder using both the lower ladder portion and the upper ladder portion of the ladder. In addition, when a worker comes out from the interior area to the external area through the entrance, the worker can remove the lower ladder portion from its in-use position so that the lower ladder portion would not (or it becomes unlikely for the lower ladder portion to) get in the way of the worker when moving out to the exterior area.

In addition, a walking floor which is provided in the external area and on which a worker can walk is preferably provided at a higher position than the travel carriage of the article transport device capable of moving in the movement sections, wherein the entrance is preferably formed in the partition such that an lower end of the entrance is at a same height as a top surface of the walking floor, wherein a second work platform is provided at a position that is at a same height as the walking floor, or that is higher than the walking floor and is lower than the work platform, and wherein the second work platform is preferably located in an area of the mast trajectory that excludes an area in which the mast is located when the article transport device is in the out-of-the-way stop position, and wherein the second work platform is preferably configured to be capable of being moved to a support position and to an out-of-the-way position.

With the arrangement described above, by moving the second work platform to its out-of-the-way position, the article transport device can move from the transporting movement section to the out-of-the-way stop position in the out-of-the-way movement section, and from the out-of-the-way stop position in the out-of-the-way movement section to the transporting movement section.

In addition, when the second work platform is in its support position, the second work platform is not located in an area in which the mast of the article transport device at rest in the out-of-the-way stop position is located. Thus, even when the article transport device is at rest in the out-of-the-way stop position, the second work platform can be moved from its out-of-the-way position to its support position.

And although the entrance is formed to one side, along the lateral direction, with respect to the mast trajectory, it is conceivable to provide peripheral devices, such as a controller which controls the article transport device, for example, to the other side with respect to the mast trajectory. When such peripheral devices are located in such a location, it would be difficult to perform a maintenance work on these devices since the peripheral devices would be located relatively far from the entrance. However, a worker who entered the interior area from the entrance can get onto the second work platform to come near the peripheral devices; thus, it is made easier for a worker to perform a maintenance work on the peripheral devices.

In addition, a worker can climb up the ladder from the second work platform to get onto the work platform, in which case, the worker can get onto the work platform without having to first get down to the travel surface on which the travel carriage travels. As such, the vertical distance covered by a worker to get onto the work platform can be reduced, making it easier for the worker to get onto the work platform.

DESCRIPTION OF REFERENCE NUMERALS AND SYMBOLS

3 Stacker crane (article transport device, first article transport device)

3R Reversed stacker crane (second article transport device)
3A First stacker crane (first article transport device)
3B Second stacker crane (second article transport device)
15 Movement section
15a Transporting movement section
15b Out-of-the-way movement section
15aA First transporting movement section
15aB Second transporting movement section
18 Travel carriage
19 Mast
20 Vertically movable member
24 Upper work platform (work platform)
25 Lower work platform (second work platform)
26 Ladder
26a Lower ladder portion
26b Upper ladder portion
W Container (article)
X Moving direction

What is claimed is:

1. An article transport facility comprising:
an article transport device capable of moving along a moving direction in movement sections to transport an article,
wherein the movement sections include a transporting movement section in which the article transport device moves when transporting an article, and an out-of-the-way movement section which is continuous with the transporting movement section and in which the article transport device moves when moving out of the transporting movement section to an out-of-the-way stop position located outside the transporting movement section,
wherein the article transport device includes a travel carriage capable of traveling along the moving direction, a mast arranged vertically on the travel carriage, a vertically movable member capable of being moved vertically and of supporting the article that is being transported,
wherein a work platform which a worker can get onto is provided at a position that is higher than the travel carriage of the article transport device which has been moved to the out-of-the-way stop position, and that is lower than an upper end of the mast,
wherein, with a lateral direction being defined to be a direction that intersects the moving direction in plan view,
wherein the work platform includes one or more out-of-trajectory portions which are located outside a mast trajectory which is a trajectory of the mast in the out-of-the-way movement section when the article transport device moves from the transporting movement section to the out-of-the-way stop position and which are located to at least one side, along the lateral direction, with respect to the mast trajectory, and one or more in-trajectory portions located in an area of the mast trajectory that excludes an area in which the mast is located when the article transport device is in the out-of-the-way stop position, and
wherein each of the one or more in-trajectory portions is configured to be capable of being moved to a support position in which a corresponding one of the one or more in-trajectory portions is located in the mast trajectory, and to an out-of-the-way position in which the corresponding one of the one or more in-trajectory portions is out of the mast trajectory along the lateral direction.

2. The article transport facility as defined in claim 1, wherein with a first direction being defined to be a direction along the moving direction and a second direction being defined to be a direction along the moving direction that is opposite from the first direction, the out-of-the-way movement section is set up on a first direction side with respect to the transporting movement section,
wherein a first article transport device, which is the article transport device, has the mast which is arranged vertically at a location that is offset in the first direction from a center, along the moving direction, of the travel carriage,
wherein a second article transport device exists in addition to the first article transport device, the second article transport device being capable of moving in the movement sections,
wherein the second article transport device includes a second travel carriage capable of traveling along the moving direction, a second mast arranged vertically on the second travel carriage, a second vertically movable member capable of being moved vertically and of supporting an article that is being transported,
wherein the second article transport device has the second mast which is arranged vertically at a location that is offset in the second direction from a center, along the moving direction, of the second travel carriage,
wherein, in addition to the one or more out-of-trajectory portions, the work platform includes a middle work platform portion, a first work platform portion, and a second work platform portion with one portion located next to another along the moving direction,
wherein each of the middle work platform portion, the first work platform portion, and the second work platform portion is capable of being individually moved to the support position and to the out-of-the-way position,
wherein a location in plan view in which the middle work platform portion is provided is located between an area in which the mast of the first article transport device is located when the first article transport device is in the out-of-the-way stop position and an area in which the second mast of the second article transport device would be located if the second article transport device was in the out-of-the-way stop position,
wherein a location in plan view in which the first work platform portion is provided overlaps with an area in which the mast of the first article transport device is located when the first article transport device is in the out-of-the-way stop position,
wherein a location in plan view in which the second work platform portion is provided overlaps with an area in which the second mast of the second article transport device would be located if the second article transport device was in the out-of-the-way stop position, and
wherein the middle work platform portion and the second work platform portion are provided as the one or more in-trajectory portions.

3. The article transport facility as defined in claim 1, wherein a second article transport device is provided in addition to a first article transport device which is the article transport device, the second article transport device being capable of moving in the movement sections,
wherein the second article transport device includes a second travel carriage capable of traveling along the moving direction, a second mast arranged vertically on the second travel carriage, a second vertically movable member capable of being moved vertically and of supporting an article that is being transported, wherein the movement sections include a first transporting movement section which is the transporting movement section in which the first article transport device moves when transporting an article, a second transporting movement section in which the second article transport device moves when transporting an article, a first out-of-the-way movement section which is the out-of-the-way movement section in which the first article transport device moves when moving out of the first transporting movement section to the out-of-the-way stop position, and a second out-of-the-way movement section in which the second article transport device moves when moving out of the second transporting movement section to the out-of-the-way stop position, and wherein an extent of space occupied by the first article transport device when the first article transport device is in the out-of-the-way stop position overlaps, along the moving direction, with an extent of space occupied by the second article transport device when the second article transport device is in the out-of-the-way stop position.

4. The article transport facility as defined in claim 1, wherein a vertically extending ladder is located, along the lateral direction, between the mast trajectory on one hand, and one of the one or more out-of-trajectory portions of the work platform that is located on one side, along the lateral direction, with respect to the mast trajectory on the other hand.

5. The article transport facility as defined in claim 4, wherein a partition is provided for partitioning an interior area, in which the article transport device, the work platform and the ladder are provided, from an external area outside the interior area, wherein an entrance for allowing a worker to enter the out-of-the-way movement section in the interior area from the external area is formed in a portion of the partition that is at a position that is lower than the work platform and that overlaps with the ladder as seen along the lateral direction, wherein the ladder is located, along the lateral direction, between the mast trajectory and the entrance formed in the partition, wherein the ladder has a lower ladder portion located at the same height as the entrance and an upper ladder portion located above the entrance, and wherein the lower ladder portion is configured to be capable of being located in an in-use position in which the lower ladder portion overlaps with the entrance as seen along the lateral direction, and of being removed from the in-used position.

6. The article transport facility as defined in claim 5, wherein a walking floor which is provided in the external area and on which a worker can walk is provided at a higher position than the travel carriage of the article transport device capable of moving in the movement sections, wherein the entrance is formed in the partition such that an lower end of the entrance is at a same height as a top surface of the walking floor, wherein a second work platform is provided at a position that is at a same height as the walking floor, or that is higher than the walking floor and is lower than the work platform, and wherein the second work platform is located in an area of the mast trajectory that excludes an area in which the mast is located when the article transport device is in the out-of-the-way stop position, and wherein the second work platform is configured to be capable of being moved to a support position and to an out-of-the-way position.

* * * * *